United States Patent
Huang

(10) Patent No.: US 10,699,943 B2
(45) Date of Patent: Jun. 30, 2020

(54) METHOD OF FORMING CONTACTS IN A SEMICONDUCTOR DEVICE

(71) Applicant: Taiwan Semiconductor Manufacturing Company, Ltd., Hsinchu (TW)

(72) Inventor: Yu-Lien Huang, Jhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 18 days.

(21) Appl. No.: 15/967,492

(22) Filed: Apr. 30, 2018

(65) Prior Publication Data
US 2019/0333806 A1   Oct. 31, 2019

(51) Int. Cl.
| H01L 21/768 | (2006.01) |
| H01L 21/033 | (2006.01) |
| H01L 21/311 | (2006.01) |
| H01L 21/027 | (2006.01) |
| H01L 21/3213 | (2006.01) |
| H01L 29/40 | (2006.01) |
| H01L 29/417 | (2006.01) |
| H01L 29/423 | (2006.01) |

(52) U.S. Cl.
CPC ...... *H01L 21/76816* (2013.01); *H01L 21/027* (2013.01); *H01L 21/0332* (2013.01); *H01L 21/0337* (2013.01); *H01L 21/0338* (2013.01); *H01L 21/31111* (2013.01); *H01L 21/31116* (2013.01); *H01L 21/32137* (2013.01); *H01L 21/32139* (2013.01); *H01L 29/401* (2013.01); *H01L 29/41791* (2013.01); *H01L 29/4238* (2013.01)

(58) Field of Classification Search
CPC ...... H01L 21/31–311; H01L 21/31105–31116; H01L 21/31127–31138; H01L 21/31144; H01L 21/7681–76811; H01L 21/32; H01L 21/32139; H01L 29/401; H01L 29/41791; H01L 21/027–0274; H01L 21/0276; H01L 21/033–0338
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |

(Continued)

*Primary Examiner* — Maliheh Malek
(74) *Attorney, Agent, or Firm* — Slater Matsil, LLP

(57) ABSTRACT

Semiconductor devices and methods of forming semiconductor devices are provided. A method includes forming a first mask layer over a target layer, forming a second mask layer over the first mask layer, patterning the second mask layer, forming a third mask layer over the patterned second mask layer, patterning the third mask layer, etching the first mask layer using both the patterned second mask layer and the patterned third mask layer as a combined etch mask, removing the patterned third mask layer to expose a portion of the first mask layer, performing a trim process on the exposed portion of the first mask layer, and etching the target layer using the first mask layer to form openings in the target layer.

20 Claims, 22 Drawing Sheets

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,305,837 B2* | 4/2016 | Wu ............... H01L 21/76831 |
| 9,520,482 B1 | 12/2016 | Chang et al. |
| 9,576,814 B2 | 2/2017 | Wu et al. |
| 9,620,380 B1 | 4/2017 | Dai et al. |
| 10,395,976 B1* | 8/2019 | Shih ............... H01L 21/31144 |
| 10,410,875 B2* | 9/2019 | Burns ............. H01L 21/0337 |
| 2003/0104319 A1* | 6/2003 | Lin ..................... G03F 7/70466 |
| | | 430/313 |
| 2005/0158982 A1* | 7/2005 | Kanamura ........ H01L 21/76801 |
| | | 438/622 |
| 2007/0020565 A1* | 1/2007 | Koh ..................... G03F 7/0035 |
| | | 430/313 |
| 2007/0298333 A1* | 12/2007 | Piumi ............... H01L 21/0271 |
| | | 430/5 |
| 2008/0305642 A1* | 12/2008 | Lee .................. H01L 21/0332 |
| | | 438/703 |
| 2009/0269682 A1* | 10/2009 | Nishimura ......... H01L 21/0337 |
| | | 430/5 |
| 2010/0167021 A1* | 7/2010 | Lee ..................... H01L 21/0332 |
| | | 428/195.1 |
| 2011/0070738 A1* | 3/2011 | Liang ............... H01L 21/76808 |
| | | 438/702 |
| 2013/0003108 A1* | 1/2013 | Agarwal ............. G03F 7/70466 |
| | | 358/1.15 |
| 2015/0111381 A1* | 4/2015 | Kim ..................... H01L 21/283 |
| | | 438/682 |
| 2015/0200096 A1* | 7/2015 | Huang ............... H01L 21/0337 |
| | | 257/390 |
| 2015/0332960 A1* | 11/2015 | Chen ................ H01L 21/31144 |
| | | 438/618 |
| 2017/0053802 A1 | 2/2017 | Park |
| 2018/0145145 A1* | 5/2018 | Chen ................... H01L 21/3085 |
| 2018/0294185 A1* | 10/2018 | Chen ................... H01L 23/5283 |
| 2018/0374712 A1* | 12/2018 | Guha ............... H01L 21/31144 |
| 2019/0035638 A1* | 1/2019 | Fan .................. H01L 21/0335 |
| 2019/0067116 A1* | 2/2019 | Fan .................. H01L 29/6681 |
| 2019/0164759 A1* | 5/2019 | Huang ............... H01L 21/0337 |
| 2019/0293867 A1* | 9/2019 | Liu ..................... G02B 5/1819 |
| 2019/0326127 A1* | 10/2019 | Fan ..................... H01L 21/0337 |
| 2019/0385902 A1* | 12/2019 | Wang ............... H01L 21/31144 |

* cited by examiner

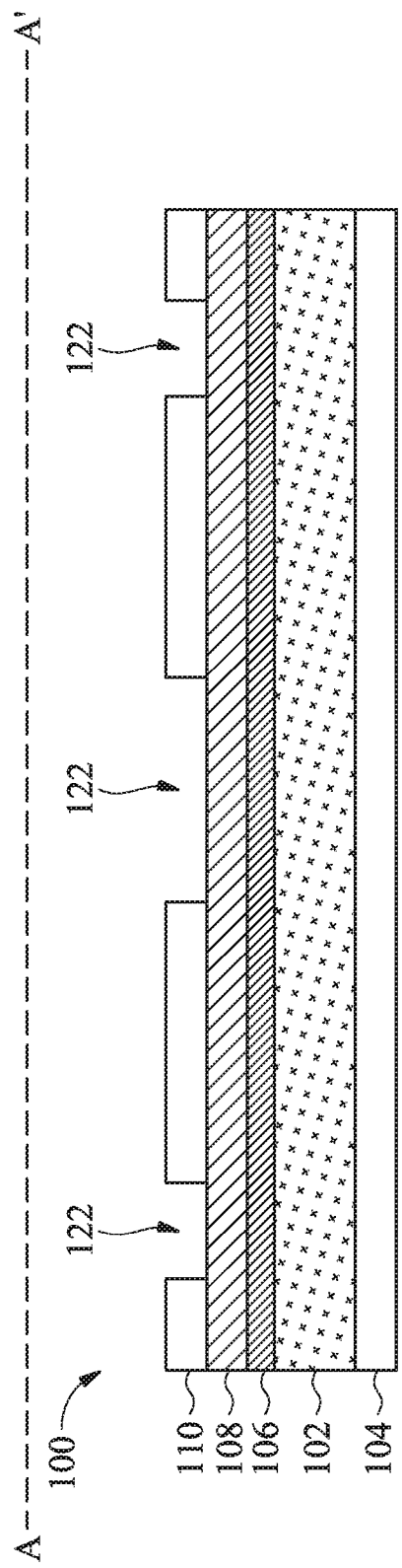
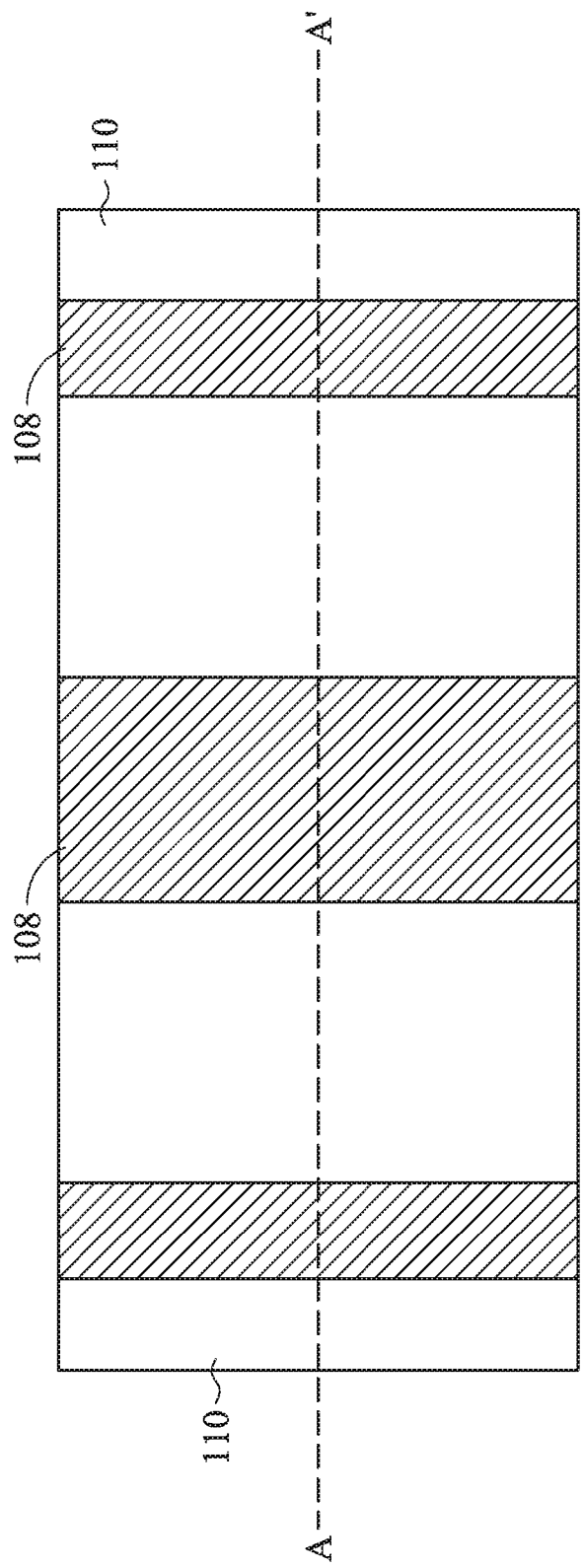
Figure 5A
Figure 5B

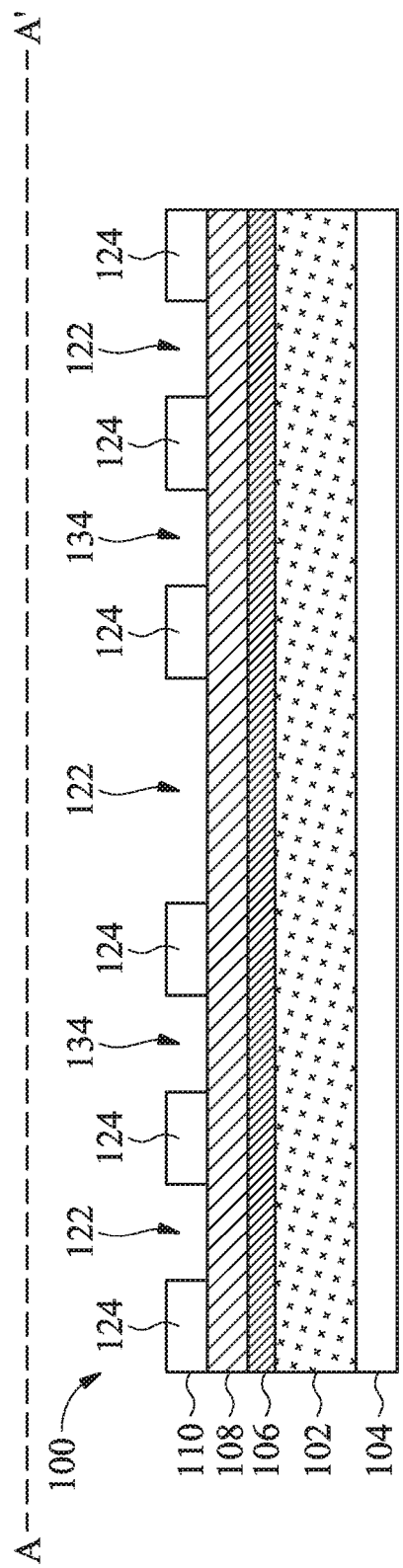
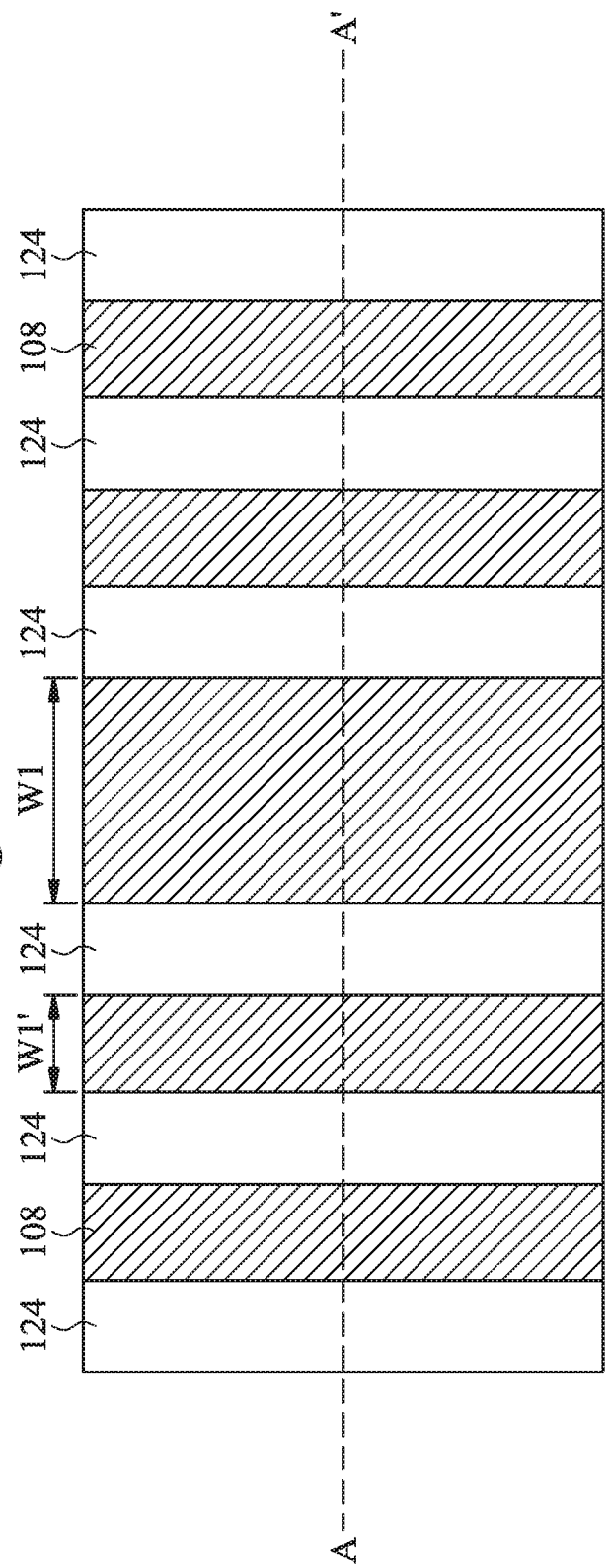
Figure 7A
Figure 7B

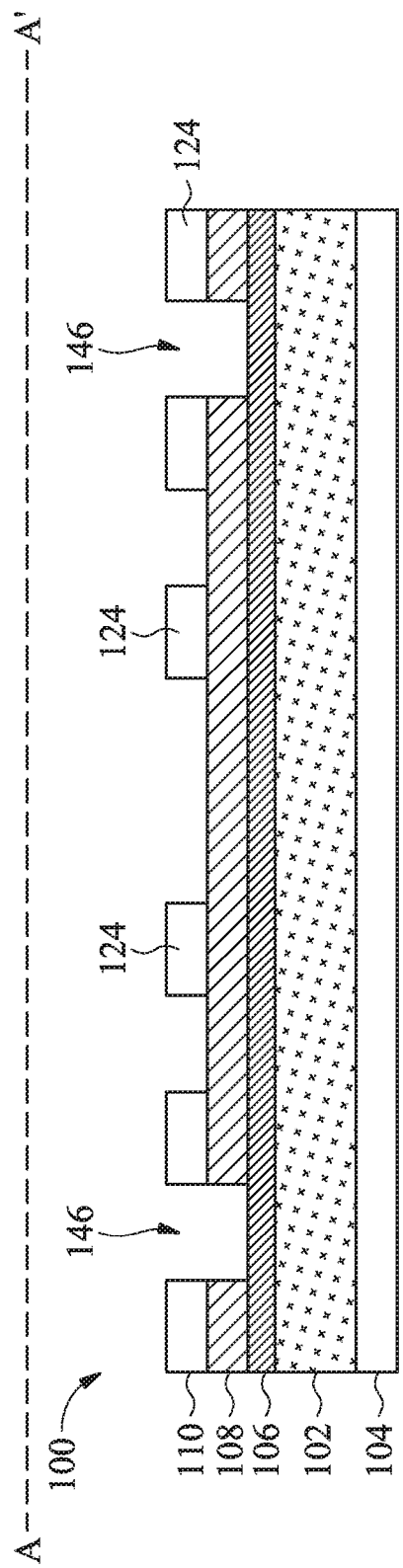
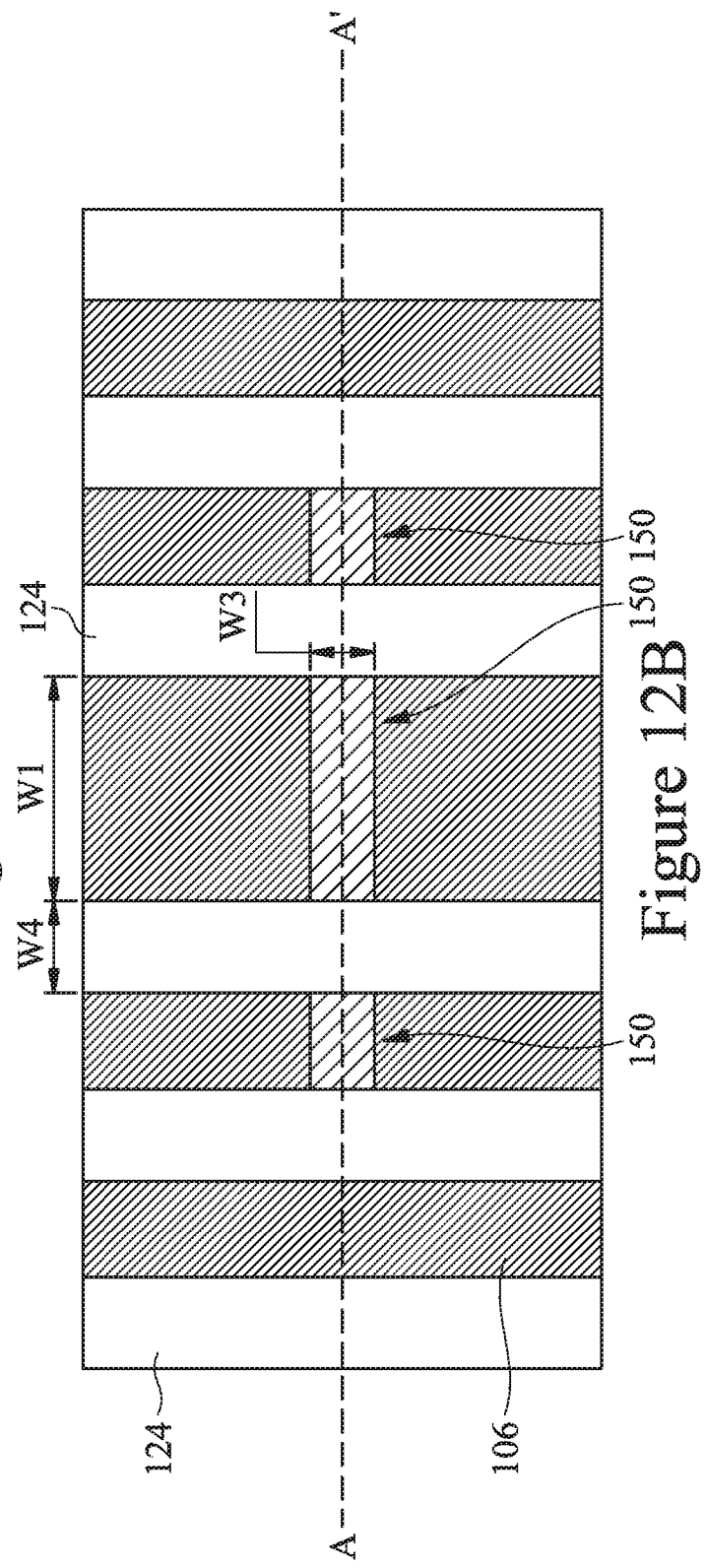
Figure 12A
Figure 12B

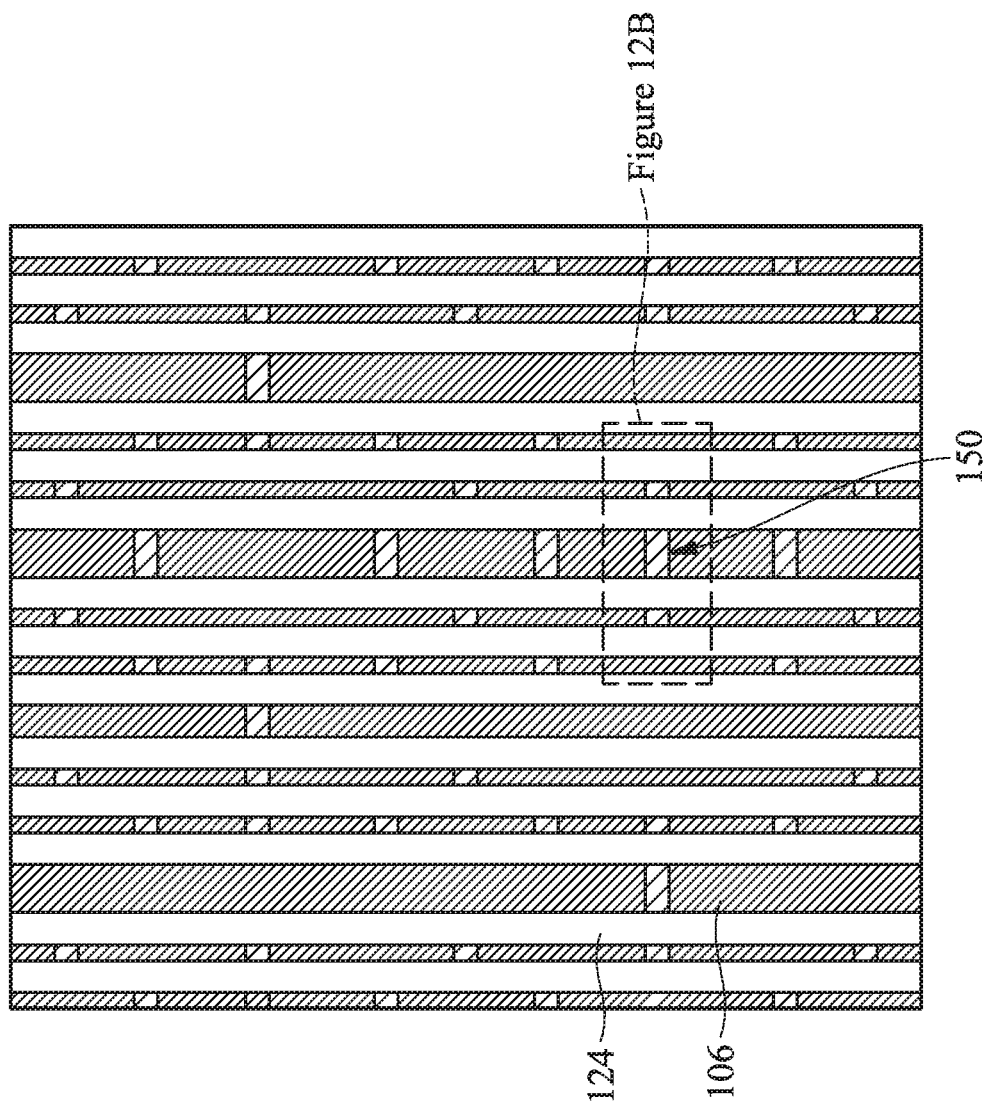

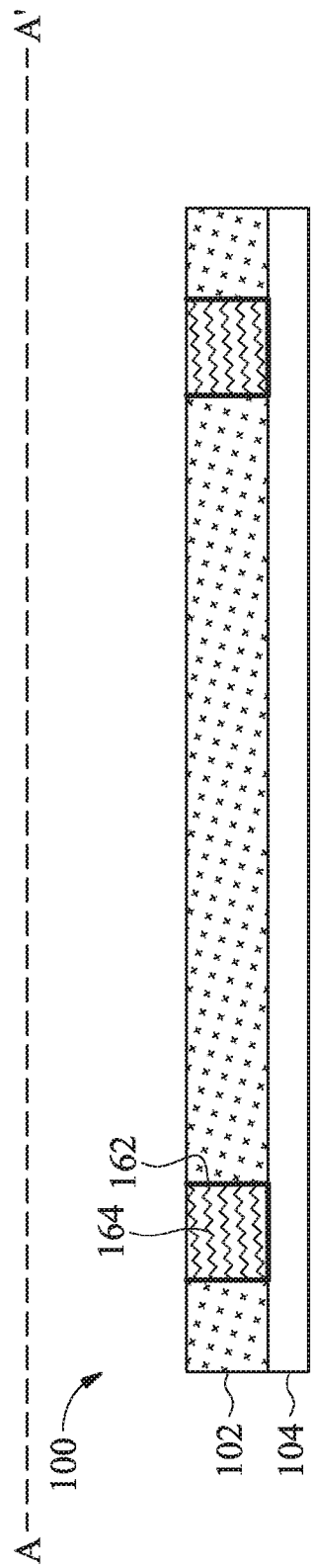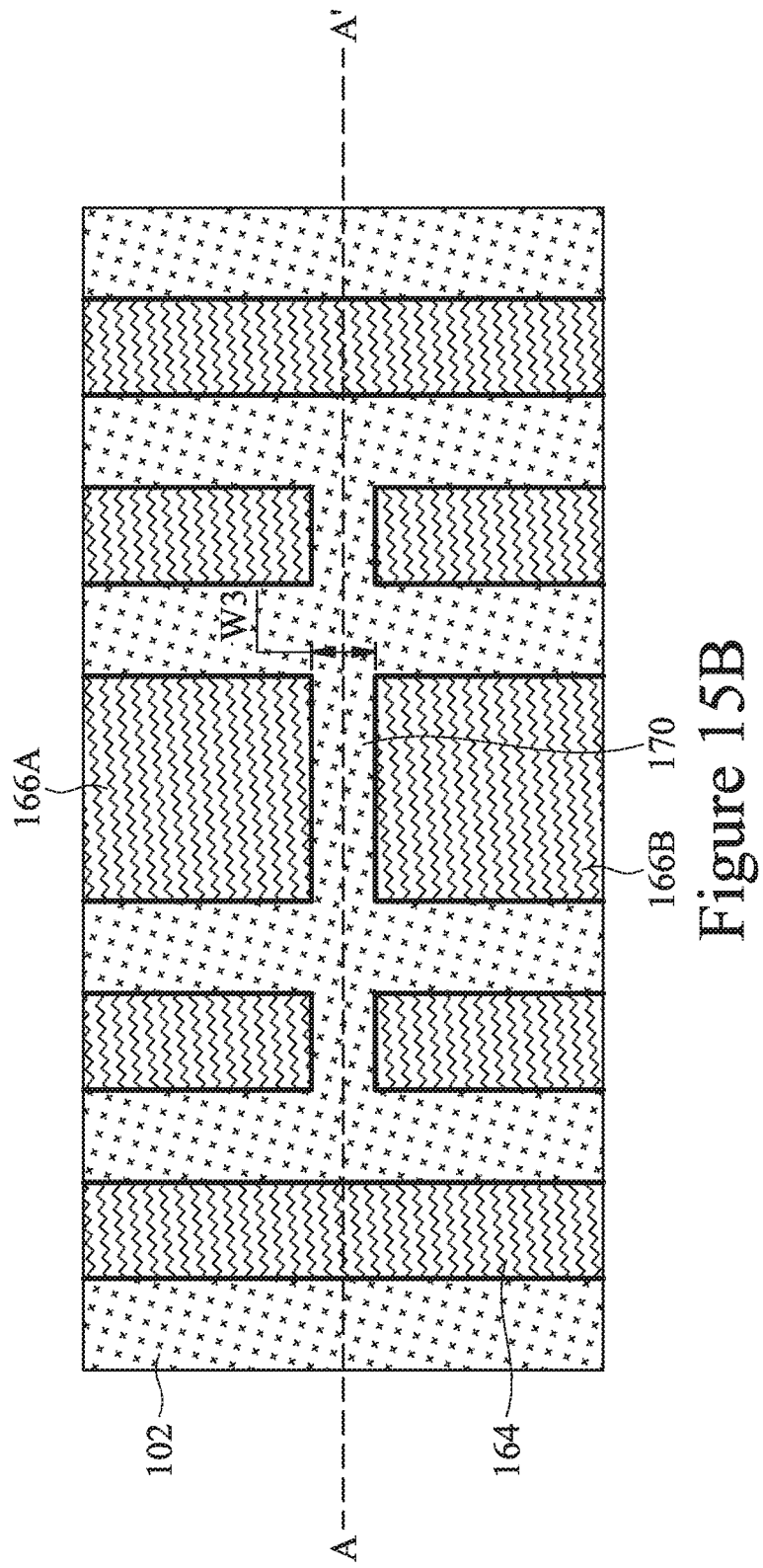

METHOD OF FORMING CONTACTS IN A SEMICONDUCTOR DEVICE

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B illustrate the removal of the masking layer in accordance with some embodiments.

FIGS. 7A-7B illustrate the further patterning of the oxide mask layer in accordance with some embodiments.

FIGS. 12A-12C illustrate the performing of a trim process in accordance with some embodiments.

FIGS. 15A-15B illustrate the formation of contacts in accordance with some embodiments.

DETAILED DESCRIPTION

Figure 1:
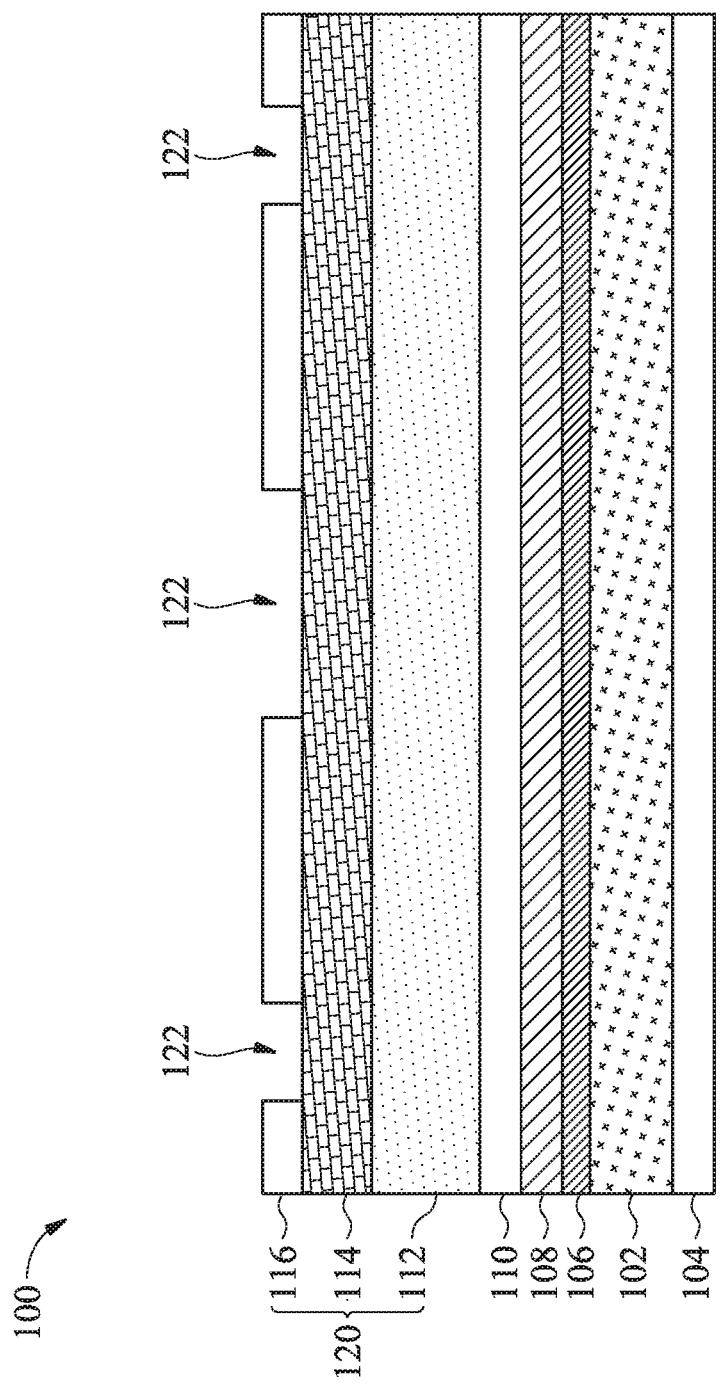
FIG. 1 illustrates the patterning of a masking layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming semiconductor devices are provided in accordance with some embodiments. In some embodiments, a patterning process is performed to pattern openings for conductive features in a target layer of a semiconductor device. For example, the patterning process may be used to form openings for contacts to a transistor device such as source/drain contacts or gate contacts. A first dielectric layer is patterned using photolithography to form a first hard mask over a second dielectric layer. A patterned photoresist is formed over the first hard mask. The first hard mask and the patterned photoresist are used to pattern the second dielectric layer. After patterning the second dielectric layer, the patterned photoresist is removed and a trim process is performed on the second dielectric layer. The trim process reduces the size of exposed portions of the second dielectric layer. The second dielectric layer is then used to pattern a target layer. The underlying target layer may be a layer used for a variety of purposes. For example, the target layer may be a low-k dielectric layer or oxide layer, in which openings are patterned using the second dielectric layer. Subsequently, conductive material(s) may be filled in the openings of the low-k dielectric layer or oxide layer to define conductive features, the conductive features having cuts as defined by the second dielectric layer. Some of the conductive features may have a fine pitch or some of the cuts may have a fine pitch.

FIGS. 1 through 15B illustrate cross-sectional views and/or plan views of intermediate stages in the formation of contacts in a target layer 102 on a semiconductor device 100, in accordance with some exemplary embodiments. In some embodiments, the contacts may be source/drain contacts or gate contacts for a Fin Field-effect Transistor device (FinFET). The cross-sectional view of FIGS. 7-15A is along line A-A' shown in the plan view of respective FIGS. 7-15B. The target layer 102 is a layer in which a pattern is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 102 is a dielectric layer such as an inter-layer dielectric (ILD) layer. In some embodiments, openings may be patterned in the target layer 102 with the embodiment processes, and contacts (e.g., contact plugs) may be formed in the openings as described below with regard to FIGS. 1-15B. For example, in FIG. 1, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as planar transistors, FinFETs, other types of transistors, diodes, capacitors, resistors, etc., may be formed in and/or on an active surface of semiconductor substrate 104. For example, the target layer 102 may be formed over the fins, metal gates, or source/drain regions of one or more FinFETs formed in the semiconductor substrate 104.

Although FIG. 1 illustrates target layer 102 being in physical contact with semiconductor substrate 104, any number of intervening layers may be disposed between target layer 102 and semiconductor substrate 104. Such intervening layers may include other ILD layers, and may have contact plugs, conductive lines, and/or vias formed therein, or may include one or more intermediary layers (e.g., etch stop layers, adhesion layers, etc.), combinations thereof, and the like. For example, an optional etch stop layer (not illustrated) may be disposed directly under the target layer 102. The etch stop layer may, for example, act as a stop for an etching process subsequently performed on the target layer 102. The material and process(es) used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), plasma vapor deposition (PVD), or the like. Other materials and processes may be used.

A hard mask layer 106 is formed over the target layer 102. The hard mask layer 106 may be formed of a material that includes a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like). In some embodiments, a material composition of the hard mask layer 106 may be determined to provide a high etch selectivity with respect to other layers such as the target layer 102, and/or to subsequently formed layers such as the silicon mask layer 108 or the oxide mask layer 110 (described in greater detail below). The hard mask layer 106 may be formed by a process such as Chemical Vapor Deposition (CVD), Atomic Layer Deposition (ALD), or the like. Other processes and materials may be used. In some embodiments, the hard mask layer 106 has a thickness between about 20 nm and about 50 nm, though in other embodiments the hard mask layer 106 may have another thickness. In subsequent processing steps, a pattern is formed on the hard mask layer 106 using patterning techniques described herein. The hard mask layer 106 is then used as an etching mask for etching the target layer 102, in which the pattern of the hard mask layer 106 is transferred to the target layer 102.

A silicon mask layer 108 is formed over the hard mask layer 106. In subsequent processing steps, a pattern is formed on the silicon mask layer 108 using patterning techniques described herein. The patterned silicon mask layer 108 is then used as an etching mask for patterning the hard mask layer 106. The silicon mask layer 108 may be formed using a process such as CVD, ALD, or the like. In some embodiments, a material composition of the silicon mask layer 108 may be determined to provide a high etch selectivity with respect to other layers such as the hard mask layer 106, the oxide mask layer 110 (described below), or other layers. The silicon mask layer 108 may include more than one layer and include more than one material. In some embodiments, the silicon mask layer 108 has a thickness between about between about 20 nm and about 50 nm, though in other embodiments the silicon mask layer 108 may have another thickness.

An oxide mask layer 110 is formed over the silicon mask layer 108. In subsequent processing steps, a pattern is formed on the oxide mask layer 110 using patterning techniques described herein. The patterned oxide mask layer 110 is then used as an etching mask for patterning the silicon mask layer 108. The oxide mask layer 110 may be formed from a silicon oxide, such as borophosphosilicate tetraethylorthosilicate (BPTEOS) or undoped tetraethylorthosilicate (TEOS) oxide, and may be formed by CVD, ALD, Plasma-enhanced Atomic Layer Deposition (PEALD), spin-on coating, or the like. The oxide mask layer 110 may include a Low-Temperature (LT) oxide layer, which is deposited at a low temperature, for example, lower than about 100° C. In some embodiments, a material composition of the oxide mask layer 110 may be determined to provide a high etch selectivity with respect to other layers such as the hard mask layer 106, the silicon mask layer 108, or other layers. The oxide mask layer 110 may include more than one layer and include more than one material. In some embodiments, the oxide hard mask layer 110 has a thickness between about between about 20 nm and about 50 nm, though in other embodiments the oxide mask layer 110 may have another thickness.

A tri-layer masking layer 120 is formed over the oxide mask layer 110. The tri-layer masking layer 120 includes a bottom layer 112, a middle layer 114 over the bottom layer 112, and an upper layer 116 over the middle layer 114. The upper layer 116 may be formed of a photoresist (e.g., a photosensitive material), which includes organic materials, and may be a positive photosensitive material or a negative photosensitive material. The bottom layer 112 may be formed of a polymer in some embodiments. The bottom layer 112 may also be a bottom anti-reflective coating (BARC) layer. The middle layer 114 may comprise an inorganic material, which may be a nitride (such as silicon nitride), an oxynitride (such as silicon oxynitride), an oxide (such as silicon oxide), or the like. The middle layer 114 may have a high etching selectivity relative to the upper layer 116 and the bottom layer 112. The various layers of the tri-layer masking layer 120 may be blanket deposited sequentially using, for example, spin-on processes. Other processes and materials may be used. Although a tri-layer masking layer 120 is discussed herein, in other embodiments, the tri-layer masking layer 120 may actually be a monolayer masking layer or a bilayer masking layer (e.g., including only the bottom layer 112 and the upper layer 116 without the middle layer 114). The type of masking layer used (e.g., monolayer masking layer, bilayer masking layer, or tri-layer masking layer) may depend on the photolithography process used to pattern the oxide mask layer 110. For example, in extreme ultraviolet (EUV) lithography processes, a monolayer masking layer or bilayer masking layer may be used.

Figure 6:
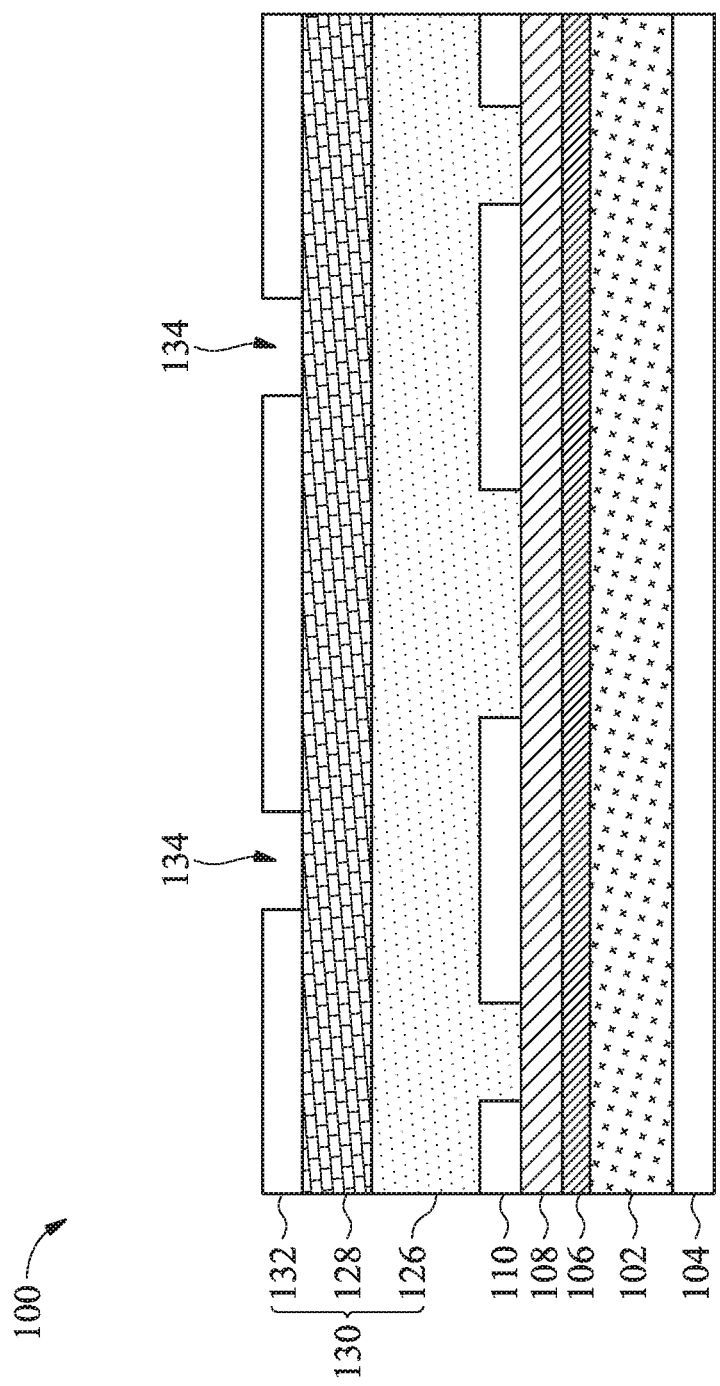
FIG. 6 illustrates the patterning of a masking layer in accordance with some embodiments.

FIGS. 1 through 7B illustrate intermediate stages in the formation of patterned openings in the oxide mask layer 110, in accordance with some exemplary embodiments. The example patterning process shown in FIGS. 1-7B uses two separate photolithographic processes to pattern the oxide mask layer 110. FIGS. 1-5 illustrate intermediate stages in the formation of first openings 122 in the oxide mask layer 110 using a first photolithographic patterning process. FIGS. 6 and 7A-7B illustrate intermediate stages in the formation of second openings 134 in the oxide mask layer 110 using a second photolithographic patterning process. In some cases, the use of two or more photolithographic patterning processes (i.e., multi-patterning) can allow for a smaller pitch of patterned features. In other embodiments, the oxide mask layer 110 is patterned using only a single photolithographic process. Other photolithographic techniques, including additional or different steps, may be used to pattern the oxide mask layer 110, and are within the scope of this disclosure.

As shown in FIG. 1, the upper layer 116 may be patterned (e.g., using a photolithographic process). Subsequently, the upper layer 116 is used as an etching mask for patterning of the middle layer 114 (see FIG. 2). The middle layer 114 is then used as an etching mask for patterning of the bottom layer 112 (see FIG. 3), and the bottom layer 112 is then used to pattern the oxide mask layer 110 (see FIG. 4). In some cases, using a tri-layer photoresist (e.g., tri-layer masking layer 120) to etch a target layer (e.g., oxide mask 110) can allow for improved definition of fine-pitched patterns in the target layer. The upper layer 116 may be patterned using any suitable photolithography process to form first openings 122 therein.

Figure 2:
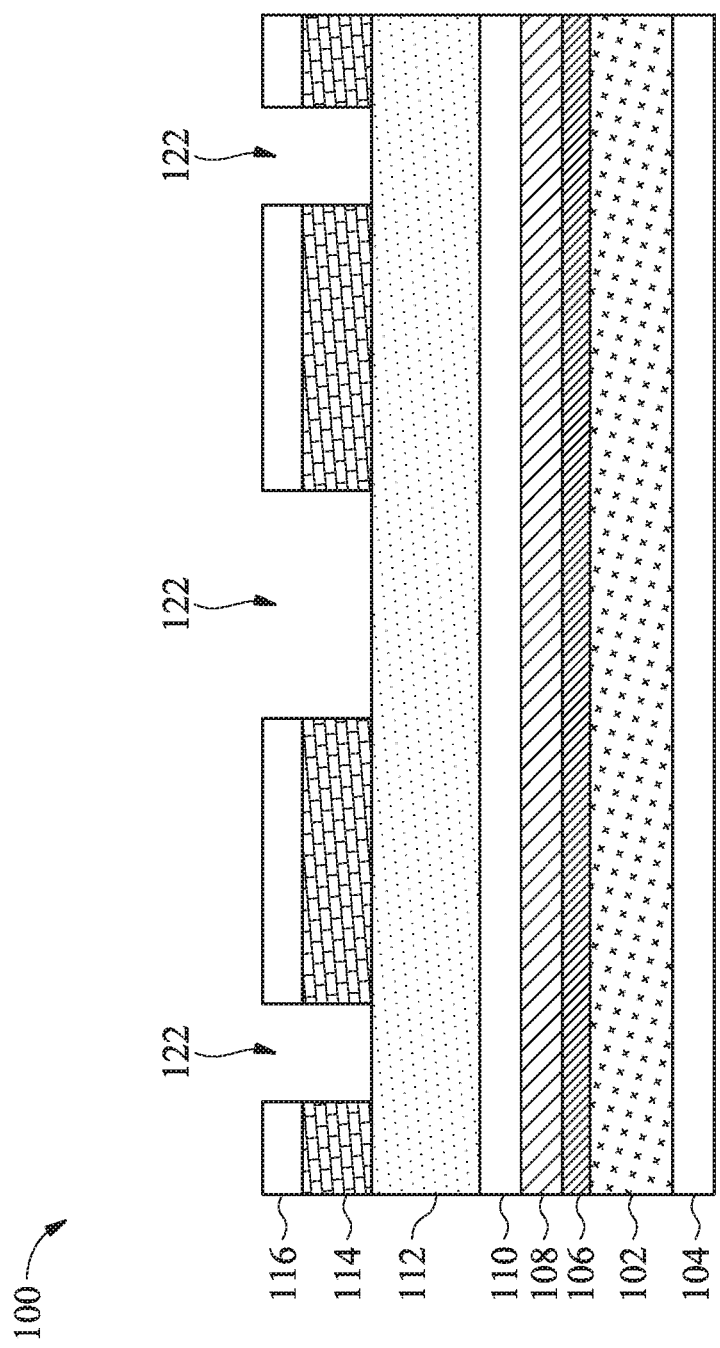
FIG. 2 illustrates the further patterning of the masking layer in accordance with some embodiments.

Referring to FIG. 2, after patterning of the upper layer 116, the pattern of the upper layer 116 is transferred to the middle layer 114 in an etching process. The etching process may be anisotropic, so that the first openings 122 in the upper layer 116 are extended through the middle layer 114 and have about the same sizes (or are slightly smaller) in the middle layer 114 as they do in the upper layer 116. The resulting structure is illustrated in FIG. 2.

Figure 3:
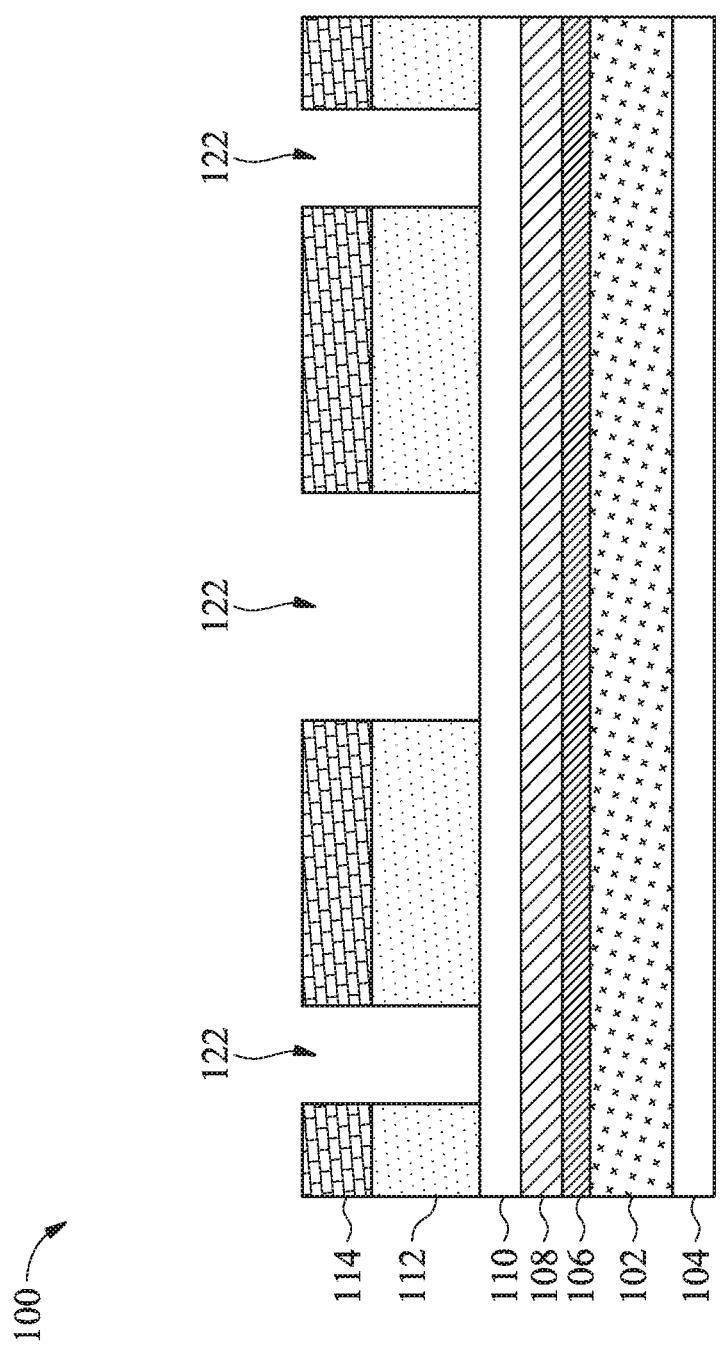
FIG. 3 illustrates the further patterning of the masking layer in accordance with some embodiments.

As shown in FIG. 3, an etching process may be performed to transfer the pattern of the middle layer 114 to the bottom layer 112, thereby extending the first openings 122 through the bottom layer 112. The etching process of the bottom layer 112 is anisotropic, so that the first openings 122 in the middle layer 114 are extended through the bottom layer 112 and have about the same sizes (or are slightly smaller) in the bottom layer 112 as they do in the middle layer 114. As part of etching the bottom layer 112, the upper layer 116 may be consumed.

Figure 4:
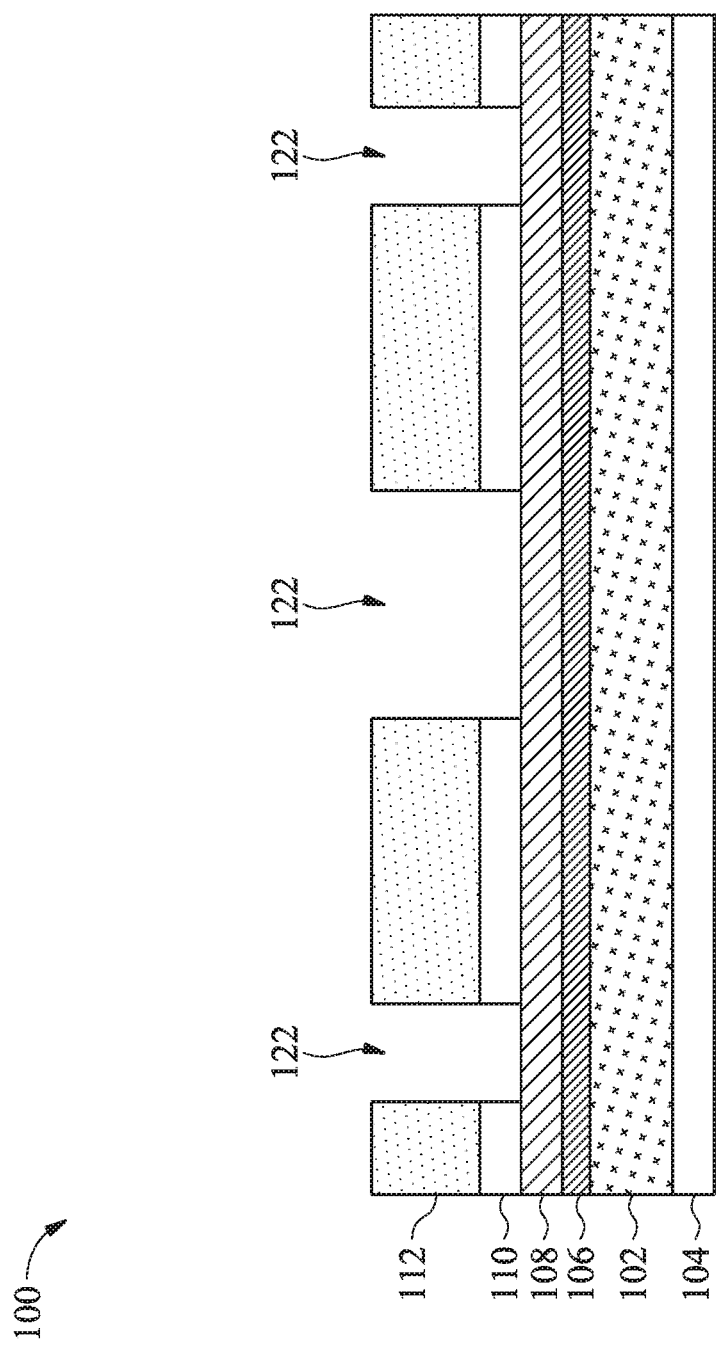
FIG. 4 illustrates the patterning of an oxide mask layer in accordance with some embodiments.

In FIG. 4, the pattern of the bottom layer 112 is transferred to the oxide mask layer 110 using an etching process. The etching process may be anisotropic, so that the first openings 122 in the bottom layer 112 are extended through the oxide mask layer 110 and have about the same sizes (or are slightly smaller) in the oxide mask layer 110 as they do in the bottom layer 112. The oxide layer 110 etching process may include a dry etching process followed by a wet clean process having a high etching selectivity of the oxide mask layer 110 relative to the silicon mask layer 108. In some embodiments, the dry etching process may include an inductively-coupled plasma generated with a power between about 100 Watts and about 800 Watts and may be performed at a pressure between about 10 mTorr and about 100 mTorr. In some embodiments, the dry etching process may use a fluorine-based process gas such as $CF_4$, $CH_2F_2$, $CHF_3$, or another type of process gas. In some embodiments, the wet clean process may include the use of HF (e.g., dilute HF), SC-1, or the like. Other etching techniques may be used in other embodiments. During the etching of the oxide mask layer 110, the middle layer 114 may be consumed, and bottom layer 112 may be at least partially consumed. In embodiments when the bottom layer 112 is not completely consumed while etching the oxide mask layer 110, an ashing process may be performed to remove remaining residue of the bottom layer 112. The remaining structure is shown in FIG. 5A (in cross-sectional view) and FIG. 5B (in plan view). The cross-sectional view of FIG. 5A is along line A-A' shown in the plan view of FIG. 5B. In the plan view of FIG. 5B, openings 122 define regions in which some contacts are formed in the target layer 102.

FIGS. 6-7B illustrate the formation of second openings 134 in the oxide mask layer 110. In FIG. 6, masking layer 130 is formed over the patterned oxide mask layer 110. In some embodiments, masking layer 130 may be similar to tri-layer masking layer 120 described above with respect to FIG. 1. Masking layer 130 may include a bottom layer 126, a middle layer 128, and an upper layer 132. The upper layer 132 may be formed of a photoresist (e.g., a photosensitive material), which include organic materials. The upper layer 132 may be a positive photosensitive material or a negative photosensitive material. In some embodiments, the bottom layer 126 may be a polymer, such as a bottom anti-reflective coating (BARC) layer. The middle layer 128 may include an inorganic material, which may be a nitride (such as silicon nitride), an oxynitride (such as silicon oxynitride), an oxide (such as silicon oxide), or the like. The middle layer 128 may have a high etching selectivity relative to the upper layer 132 and the bottom layer 126. The various layers of the masking layer 130 may be blanket deposited sequentially using, for example, spin-on processes. Other processes and materials may be used. Although a tri-layer masking layer 130 is discussed herein, in other embodiments, the masking layer 130 may be a monolayer masking layer or a bilayer masking layer (e.g., comprising only the bottom layer 126 and the upper layer 132 without the middle layer 128).

In FIG. 6, the upper layer 132 is patterned using a photolithographic process to form openings 134. Subsequently, the upper layer 132 is used as an etching mask for patterning of the middle layer 128. The middle layer 128 is then used as an etching mask for patterning of the bottom layer 126, and the bottom layer 126 is then used to pattern second openings 134 in the oxide mask layer 110 (see FIGS. 7A-7B). The patterning of the upper layer 132, middle layer 128, bottom layer 126, and the oxide mask layer 110 may be performed using any suitable photolithography processes. For example, the patterning stages of masking layer 130 may be similar to the patterning stages of tri-layer masking layer 120 described above with respect to FIGS. 1-4.

In FIGS. 7A-7B, the pattern of second openings in upper layer 132 has been transferred to the oxide mask layer 110 using photolithographic processes. In this manner, oxide masks 124 are defined from remaining portions of the oxide mask layer 110 (e.g., portions of oxide mask layer 110 between first openings 122 and second openings 134). The remaining structure is shown in FIG. 7A (in cross-sectional view) and FIG. 7B (in plan view). The cross-sectional view of FIG. 7A is along line A-A' shown in the plan view of FIG. 7B. In the plan view of FIG. 7B, first openings 122 and second openings 134 form gaps between adjacent oxide masks 124 that expose portions of the silicon mask layer 108. A first example gap having a width W1 and a second example gap having a width W1' are labeled in FIGS. 7A-7B. In some embodiments, the gaps between adjacent oxide masks 124 may have a lateral width (e.g., widths W1 or W1') of between about 10 nm and about 100 nm. For example, width W1 may be between about 20 nm and about 100 nm, and width W1' may be between about 10 nm and about 30 nm. Different gaps may have different widths, or a single gap may have multiple widths.

Figure 8A:
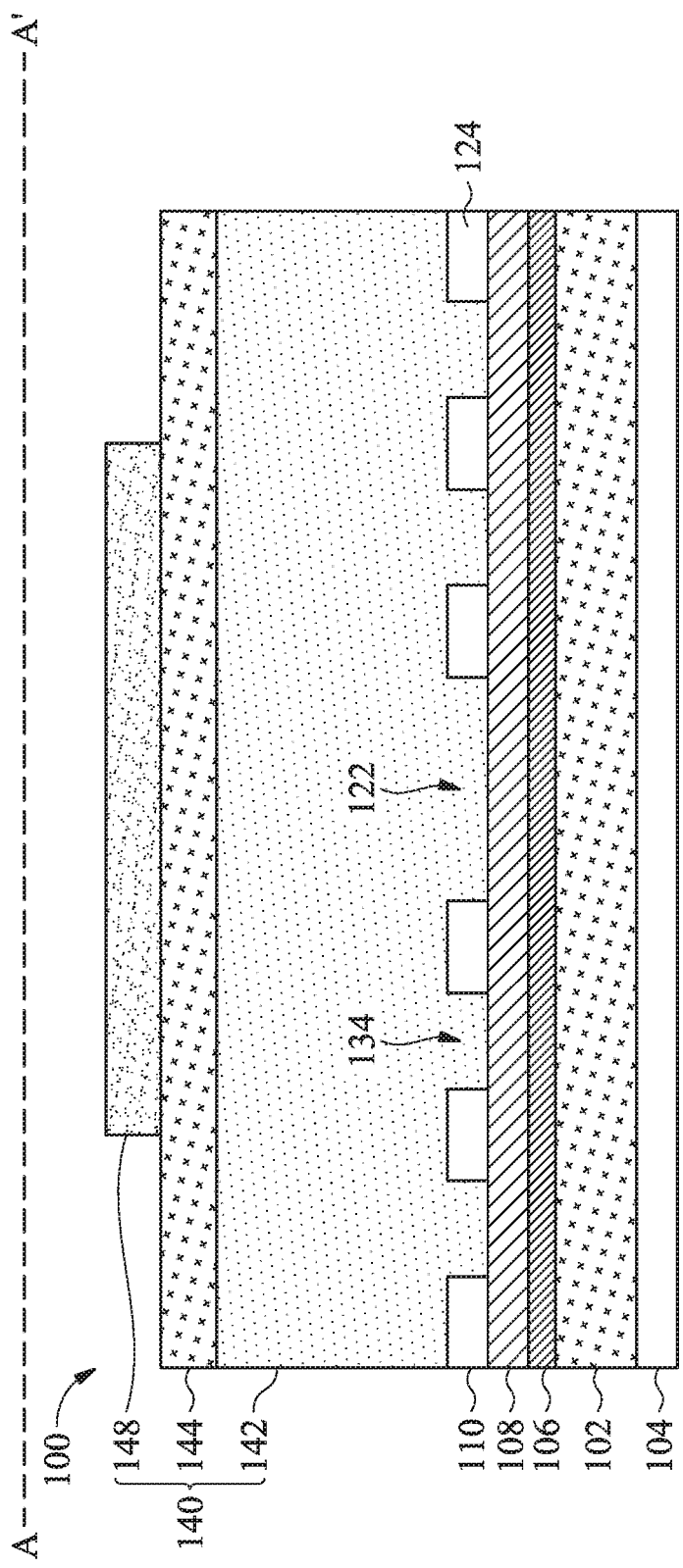
FIGS. 8A-8C illustrate the patterning of a masking layer in accordance with some embodiments.
Figure 8B:
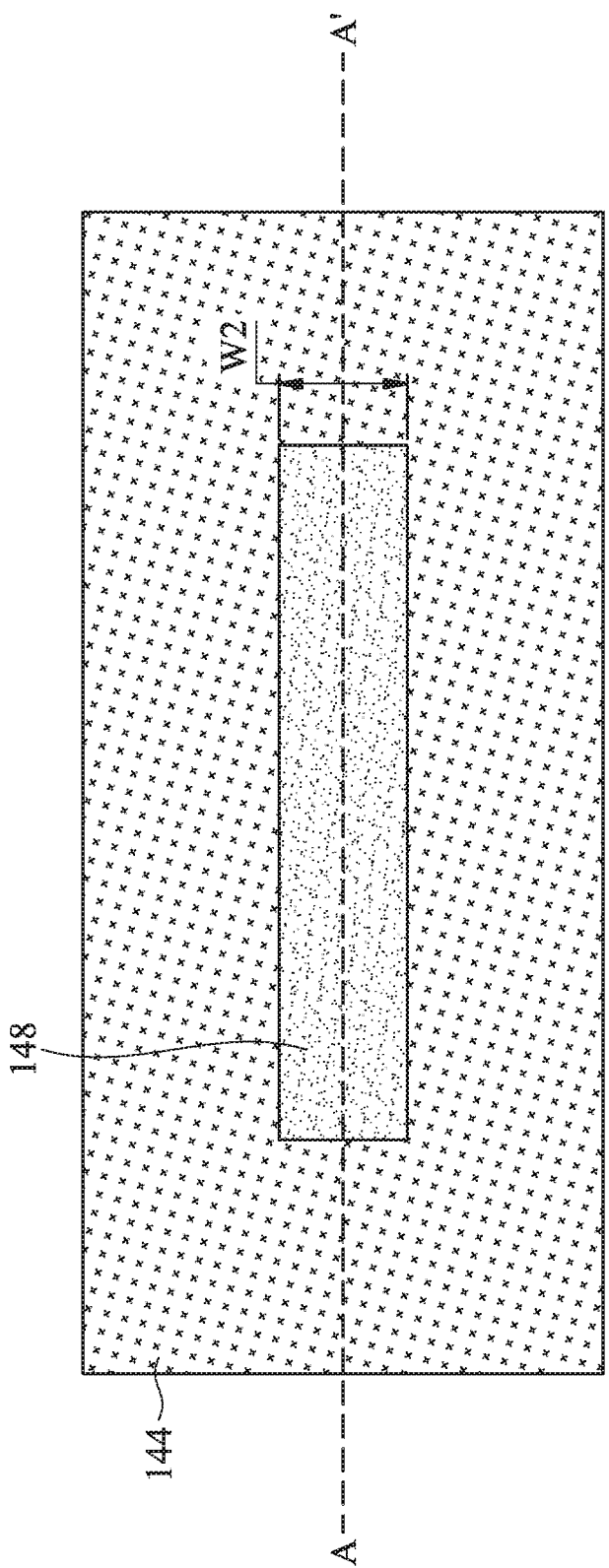
Figure 8C:
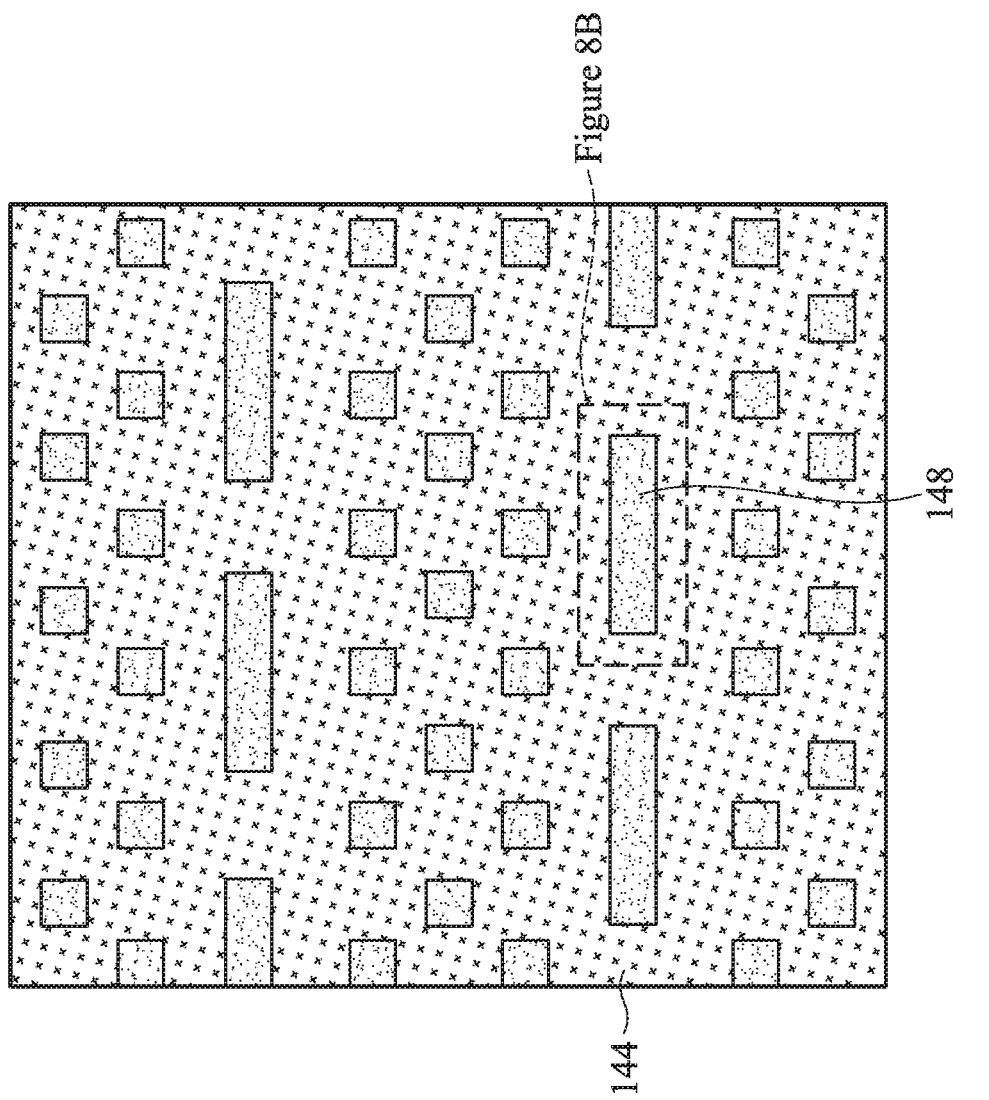

Referring to FIGS. 8A-8C, a masking layer 140 is formed over the oxide masks 124 and the silicon mask layer 108. In FIGS. 8A-15B, the "B" figure is a plan view, and the "A" figure is a cross-sectional view of the "B" figure along line A-A'. Masking layer 140 may include a bottom layer 142, a middle layer 144 and an upper layer 148. Although a trilayer masking layer 140 is shown, in some embodiments the masking layer 140 may be a monolayer masking layer or a bilayer masking layer as discussed above. In some embodiments, the upper layer 148 may be formed of a photoresist (e.g., a photosensitive material), which include organic materials. Upper layer 148 may be formed of a positive photosensitive material or a negative photosensitive material. In some embodiments, the bottom layer 142 may be a polymer such as a bottom anti-reflective coating (BARC) layer. The middle layer 144 may comprise an inorganic material, which may be a nitride (such as silicon nitride), an oxynitride (such as silicon oxynitride), an oxide (such as silicon oxide), or the like. The middle layer 144 has a high etching selectivity relative to the upper layer 148 and the bottom layer 142. The various layers of the tri-layer masking layer 140 may be blanket deposited sequentially using, for example, spin-on processes. Other processes and materials may be used.

Figure 9A:
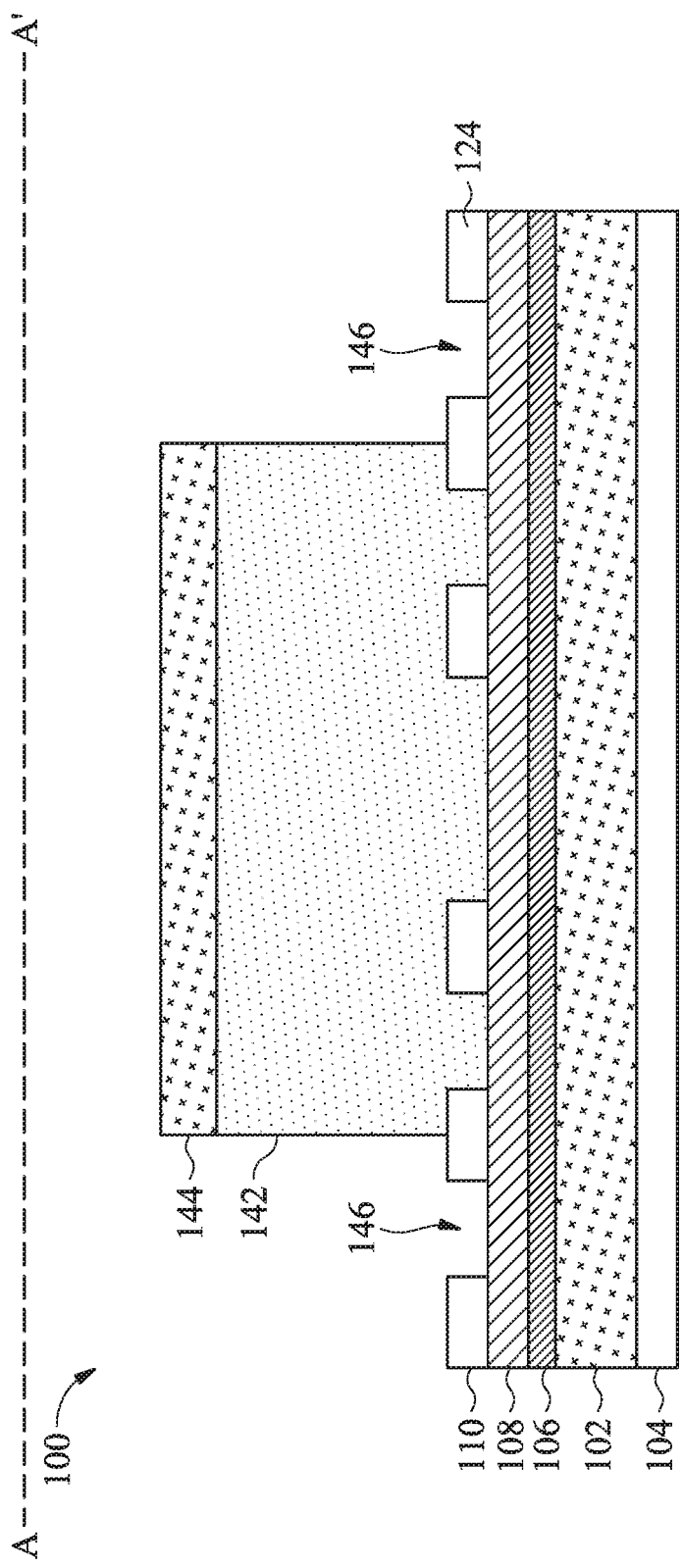
FIGS. 9A-9B illustrate the further patterning of the masking layer in accordance with some embodiments.
Figure 9B:
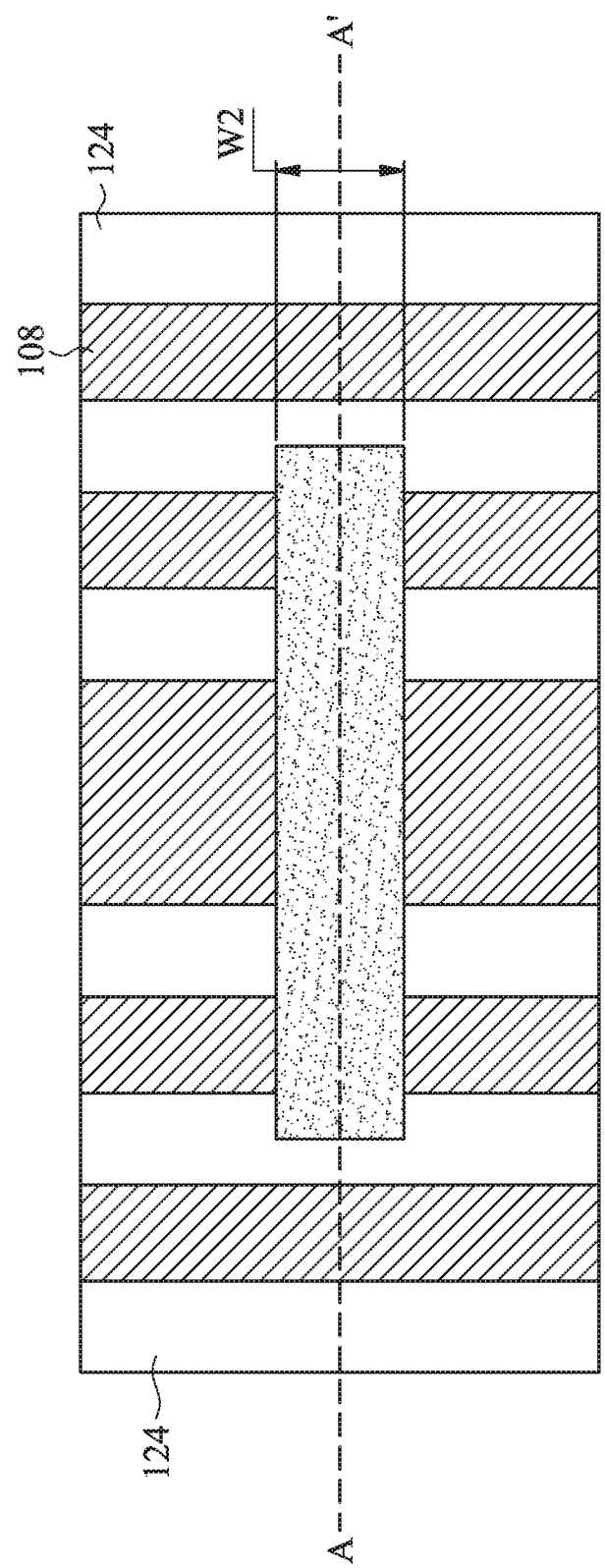

In FIGS. 8A-8C, the upper layer 148 is patterned using a photolithographic process. The example patterned region of upper layer 148 has a rectangular shape in plan view (see FIG. 8B), and may have a lateral width W2 of between about 30 nm and about 80 nm. The patterned region of upper layer 148 shown in the plan view of FIG. 8B may be part of multiple patterned regions, as shown in the expanded plan view of FIG. 8C. An example region that may correspond to FIG. 8B is indicated in FIG. 8C. A patterned region of upper layer 148 may have a length extending across two or more adjacent oxide masks 124. In other cases, the upper layer 148 may have multiple patterned regions, and the patterned regions may have shapes other than a rectangular shape. Subsequently, the patterned upper layer 148 is used as an etching mask for patterning of the middle layer 144. The middle layer 144 is then used as an etching mask for patterning of the bottom layer 142. The patterned bottom layer 142 covers regions of first openings 122 and/or second openings 134. The uncovered openings are labeled in FIGS. 9A-9B as openings 146. The remaining structure is depicted in FIGS. 9A-9B, in which regions of the silicon mask layer 108 are exposed through openings 146. The patterning of the upper layer 148, the middle layer 144, and the bottom layer 142 may be performed using any suitable photolithography processes. For example, the patterning stages of masking layer 140 may be similar to the patterning stages of tri-layer masking layer 120 or of masking layer 130, described above. In the plan view of FIG. 9B, the regions of the silicon mask layer 108 that are exposed through openings 146 may define regions in which contacts are formed in the target layer 102.

The regions of the silicon mask layer 108 that are covered by bottom layer 142 may define where cuts are located between contacts subsequently formed in the target layer 102, described in greater detail below.

Figure 10A:
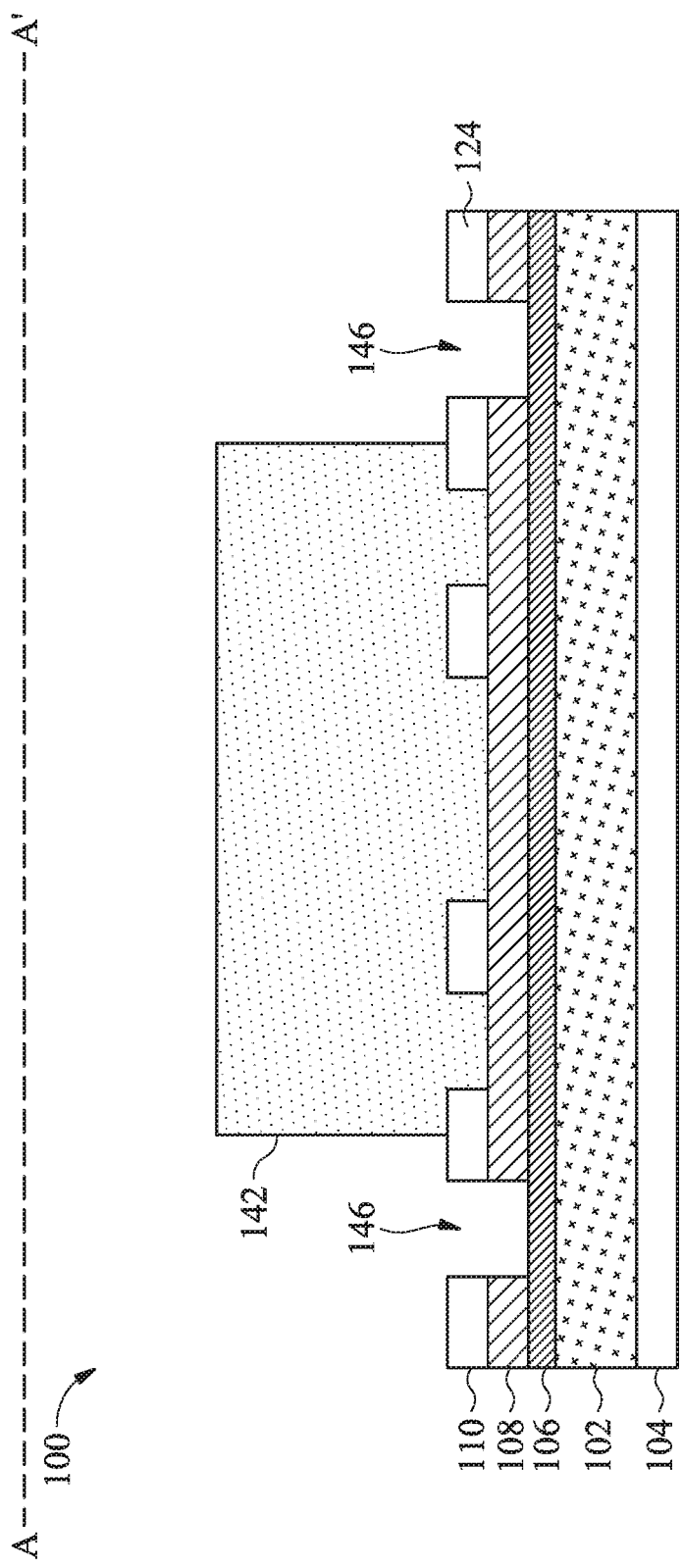
FIGS. 10A-10B illustrate the patterning of a silicon mask layer in accordance with some embodiments.
Figure 10B:
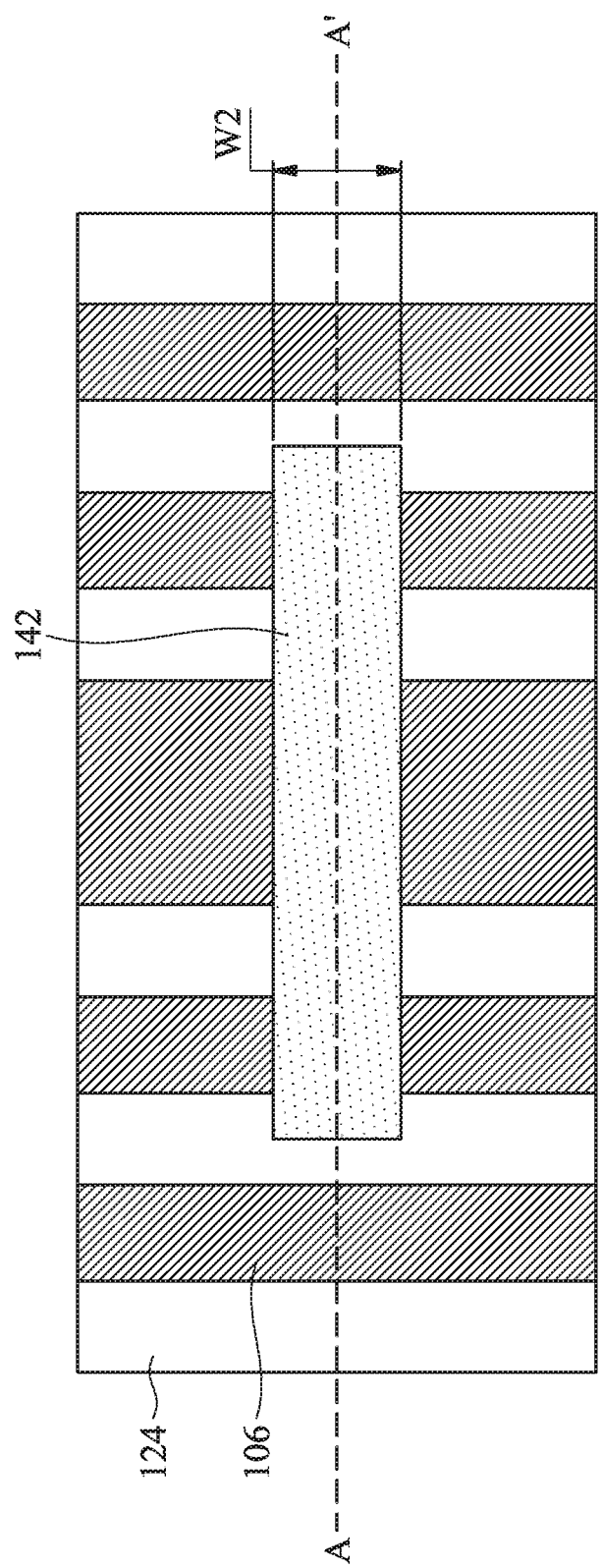
Figure 11A:
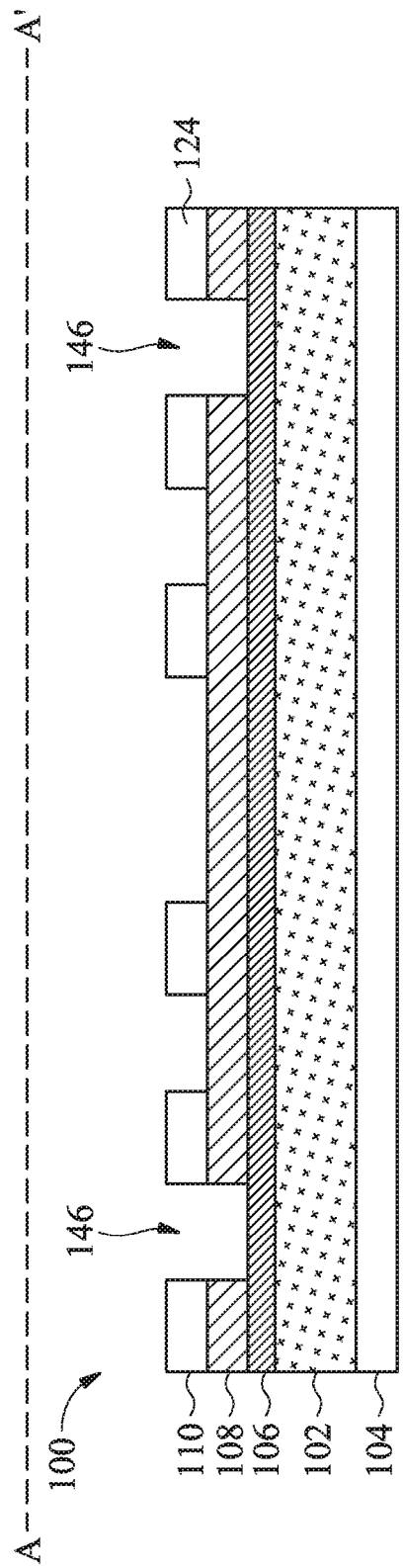
FIGS. 11A-11C illustrate the removal of the masking layer in accordance with some embodiments.
Figure 11B:
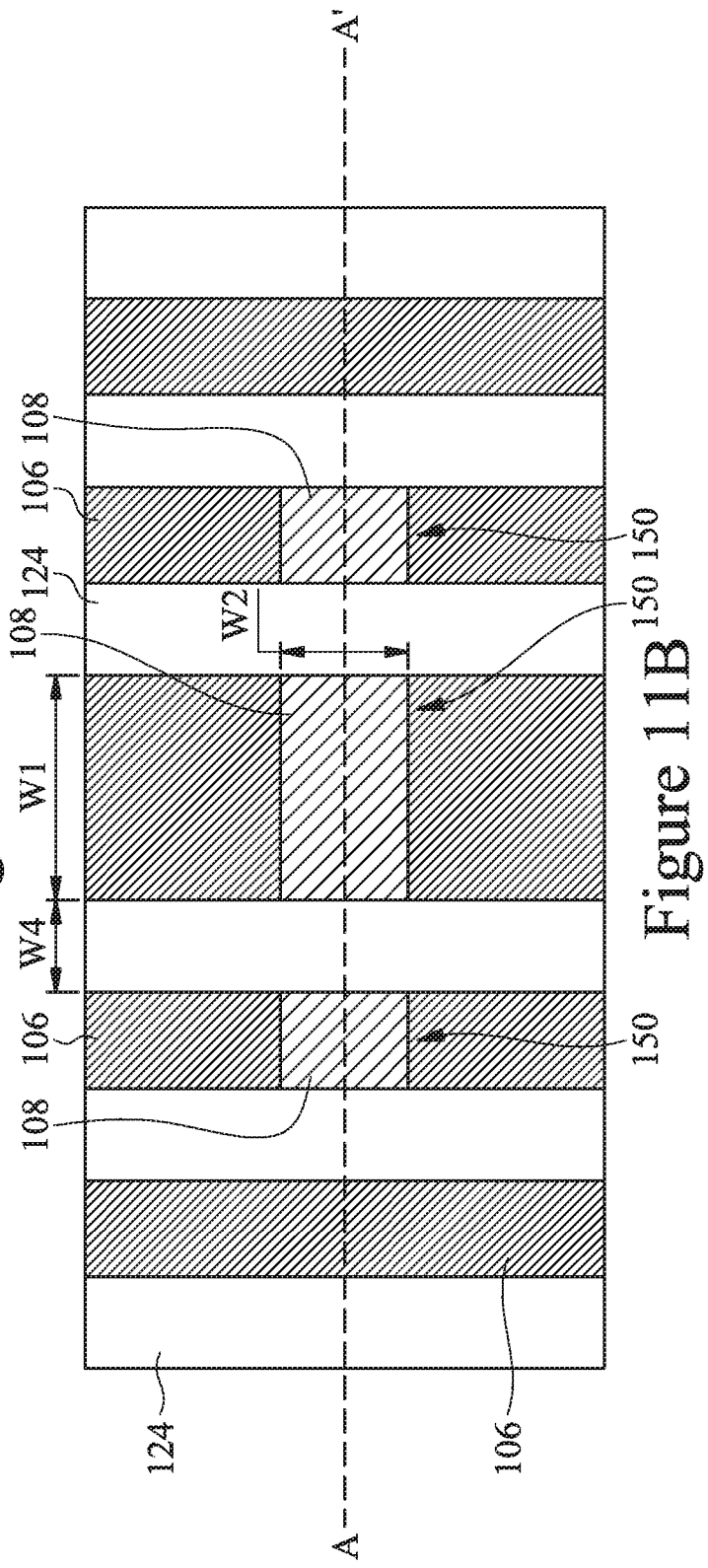
Figure 11C:
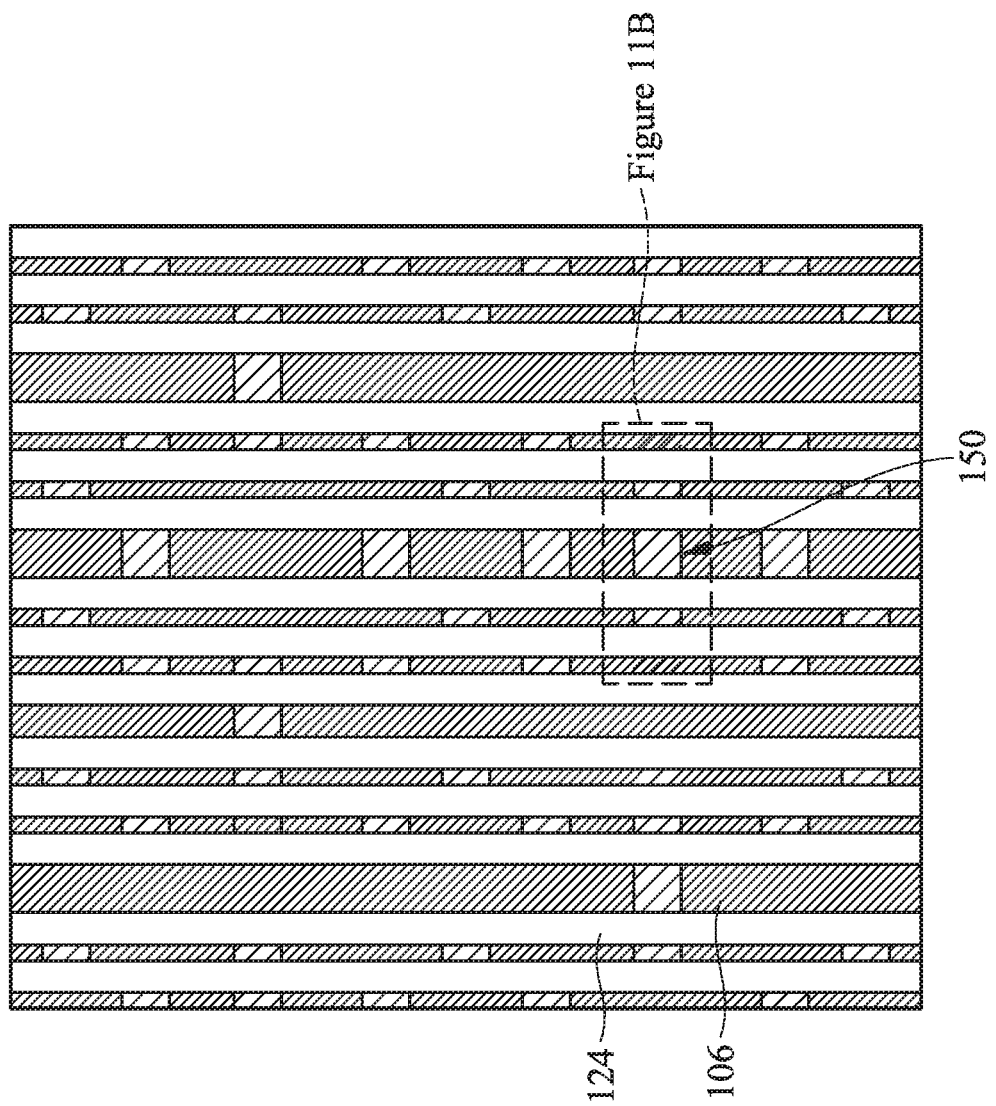

Referring to FIGS. 10A-10B, exposed portions of the silicon mask layer 108 are removed using an etching process. The etching process may be anisotropic, so that the openings 146 in the oxide mask layer 110 are extended through the silicon mask layer 108 and have about the same sizes (or are slightly smaller) in the silicon mask layer 108 as they do in the oxide mask layer 110. The openings 146 expose regions of the hard mask layer 106. The etching process may be anisotropic, and may include a dry etching process having a high etching selectivity of the silicon mask layer 108 relative to the oxide mask layer 110. The etching process may also have a high etching selectivity of the silicon mask layer 108 relative to the hard mask layer 106. For example, the etching process may include a plasma etching process. In some embodiments, the plasma etching process may include an inductively-coupled plasma generated with a power between about 100 Watts and about 800 Watts and may be performed at a pressure between about 10 mTorr and about 100 mTorr. In some embodiments, the plasma etching process may use $Cl_2$, HBr, a fluorine-based process gas such as $CF_4$, $CH_2F_2$, $CHF_3$, or another type of process gas. Other process gases or etching techniques may be used in other embodiments. In some cases, during the etching of the silicon mask layer 108, the middle layer 144 may be consumed, and bottom layer 142 may be at least partially consumed. In embodiments when the bottom layer 142 is not completely consumed while etching the silicon mask layer 108, an ashing process may be performed to remove remaining residue of the bottom layer 142. The remaining structure is depicted in FIGS. 11A-11C. After removing the bottom layer 142, portions of the silicon mask layer 108 not covered by the oxide mask layer 110 and previously covered by the bottom layer 142 are exposed, and are labeled in FIG. 11B as exposed portions 150. The exposed portions 150 shown in the plan view of FIG. 11B may be part of larger patterned regions, as shown in the expanded plan view of FIG. 11C. An example region that may correspond to FIG. 11B is indicated in FIG. 11C.

In FIGS. 12A-12C, a trim process is performed to decrease the lateral width of exposed portions 150. The trim process may be isotropic or anisotropic, and may be a dry process or a wet process. The trim process may include an etching process that selectively etches the silicon mask layer 108 relative to the oxide mask layer 110 or the hard mask layer 106. The exposed portions 150 shown in the plan view of FIG. 12B may be part of larger patterned regions, as shown in the expanded plan view of FIG. 12C. An example region that may correspond to FIG. 12B is indicated in FIG. 12C.

In some embodiments, the trim process includes a plasma etching process, in which the exposed portions 150 are subjected to a plasma. In some embodiments, the plasma etching process is performed in a processing chamber with a process gas being supplied into the processing chamber. Process gases may include HBr, $Cl_2$, other gases, or a combination of gases. Carrier gases, such as nitrogen, argon, helium, xenon, or the like, may be used to carry process gases into the processing chamber. The plasma etching process may be performed at a temperature between about 20° C. and about 60° C., such as about 40° C. A pressure in the processing chamber may be between about 50 mTorr and about 200 mTorr. The plasma exposure may be for a pre-determined duration of time, such as between about 20 seconds and about 200 seconds. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as transformer coupled plasma generator, inductively coupled plasma systems, magnetically enhanced reactive ion techniques, electron cyclotron resonance techniques, or the like.

In other embodiments, the trim process includes a wet etching process. The wet etching process may include using an etchant such as $NH_4OH$ or a mixture of $NH_4OH$, $H_2O_2$, and $H_2O$ (i.e., APM), though other etchants or wet etching techniques may be used in other embodiments. The wet etching process may be performed at a temperature between about 20° C. and about 80° C., such as about 60° C. The wet etching process may be performed for a pre-determined duration of time, such as between about 10 seconds and about 300 seconds. In some embodiments, $NH_4OH$ may be used as an etchant at a concentration between about 1%/vol. and about 10%/vol. In some embodiments, after the trim process, an optional wet cleaning may be performed to remove any remaining portions of the oxide mask layer 110.

The trim process reduces the size of the exposed portions 150, such as the lateral dimensions of the exposed portions 150. For example, the trim process may reduce width W2 of the exposed portions 150 (shown in FIG. 11B) to a smaller width W3 (shown in FIG. 12B). In some embodiments, the trim process may reduce W2 by between about 5 nm and about 10 nm. In some embodiments, width W3 may be between about 20 nm and about 75 nm. For example, the trim process may reduce a width W2 of about 30 nm to a width W3 of about 20 nm, though other values of width W2 or width W3 are possible. In some cases, different portions of the exposed portions 150 may have different widths, and the trim process may reduce these different widths by a similar amount.

In some cases, the trim process also reduces the thickness of the exposed portions 150. In some embodiments, the trim process may reduce the thickness of the exposed portions an amount between about 5 nm and about 10 nm. In some cases, portions of the silicon mask layer 108 that are covered by the oxide mask layer 110 are protected from the trim process, and thus experience little or no reduction in size from the trim process. For example, a portion of the silicon mask layer 108 under an oxide mask 124 may have a width W4 prior to the trim process (shown in FIG. 11A), and may have the same width W4 or approximately the same width W4 after the trim process (shown in FIG. 12A). In some embodiments, width W4 may be between about 50 nm and about 200 nm. In some cases, the trim process may undercut portions of the silicon mask layer 108 covered by the oxide mask layer 110. An exposed portion 150 extending completely across two adjacent oxide masks 124 prior to the trim process may remain extending completely across the two adjacent oxide masks 124 after the trim process. In this manner, the trim process may reduce the size of some exposed portions 150 along one dimension (i.e., width) but not along another dimension (i.e., length).

In the plan view of FIG. 12B, the regions of the hard mask layer 106 that are exposed through openings 146 may define regions in which contacts are formed in the target layer 102. The exposed portions 150 of silicon mask layer 108 may define where cuts are located between the contacts subsequently formed in the target layer 102. By using a trim process to decrease the lateral width of the exposed portions 150, the cut pitch may be decreased, and adjacent contacts may be separated by a smaller distance. The use of a trim process as described can also allow for a small cut pitch while reducing the possibility of an incomplete cut that connects adjacent contacts.

Figure 13A:
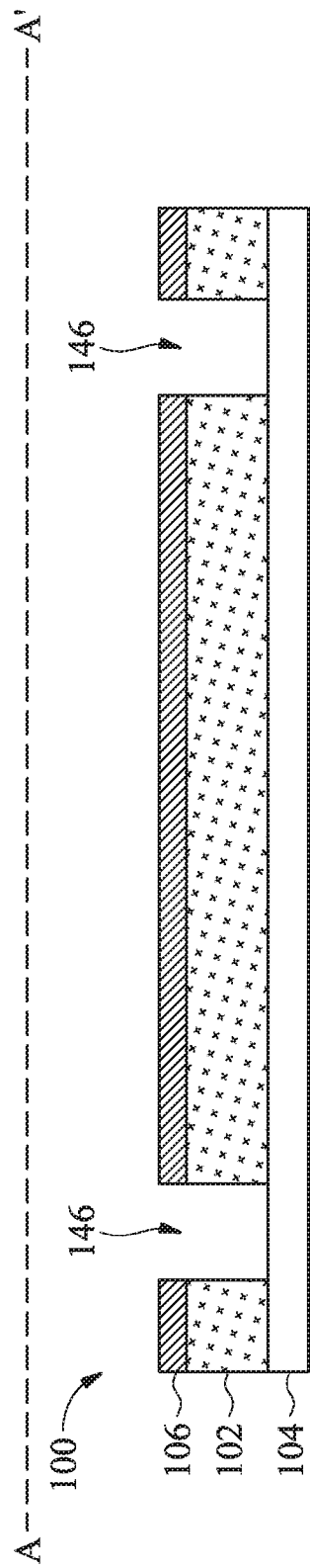
FIGS. 13A-13B illustrate the patterning of a hard mask layer and a target layer in accordance with some embodiments.
Figure 13B:
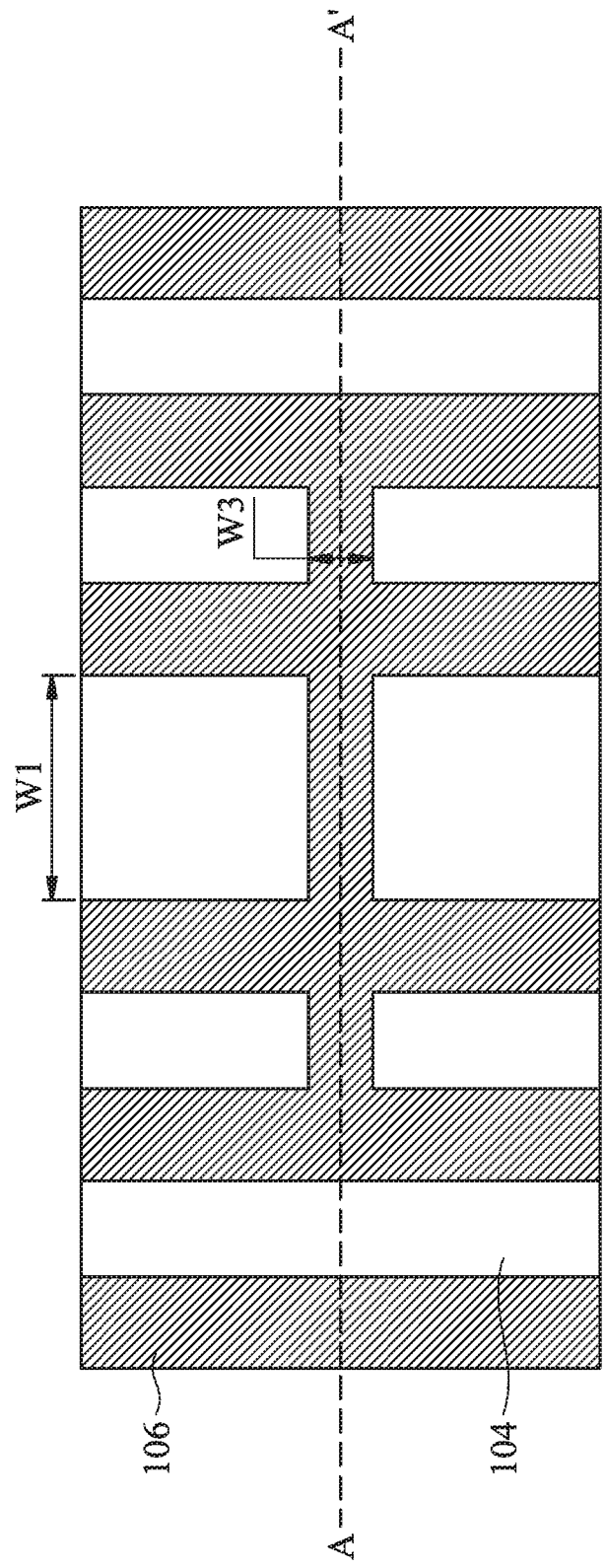

In FIGS. 13A-13B, the silicon mask layer 108 is used as an etching mask to extend openings 146 into the target layer 102, thus forming contact openings in the target layer 102. For example, openings 146 may expose source/drain regions of a FinFET device within substrate 104 in order to form source/drain contacts for the FinFET device, and/or expose metal gate regions of a FinFET device within substrate 104 in order to form gate contacts for the FinFET device. Etching the target layer 102 may include an anisotropic dry etch process and/or a wet etch process, which sequentially etches through the hard mask layer 106 to the target layer 102. Remaining portions of the target layer 102 may have a same pattern as the silicon mask layer 108 of FIGS. 12A-12B. As such, target layer 102 may be patterned in a single patterning step. In some cases, during the etching of the hard mask layer 106 and the target layer 102, the oxide mask layer 110 and the silicon mask layer 108 may be consumed, as shown in FIGS. 13A-13B. After the openings 146 are patterned, a wet cleaning process may be performed to remove any remaining portions of the oxide mask layer 110, silicon mask layer 108, or hard mask layer 106.

Figure 14A:
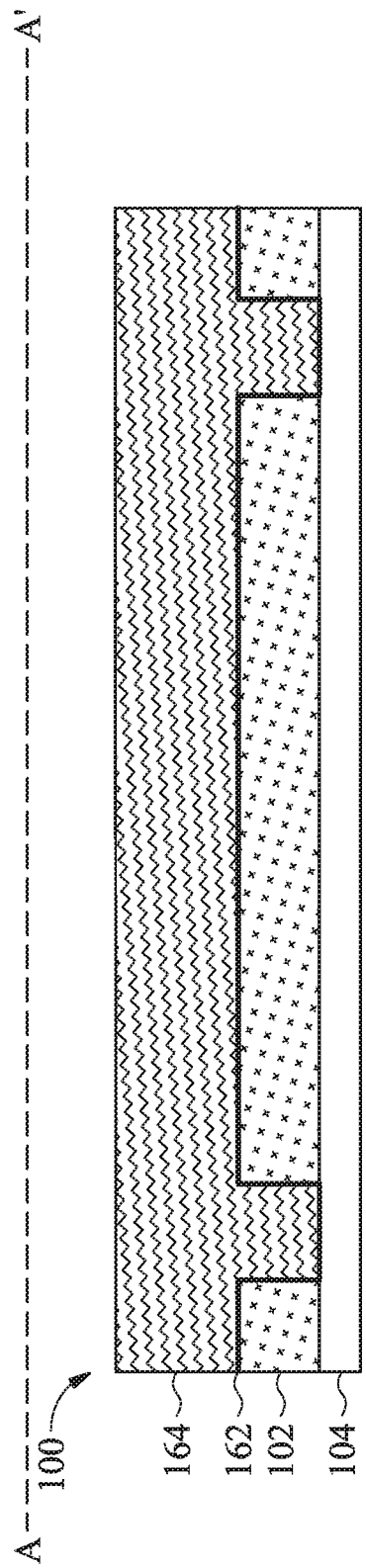
FIGS. 14A-14B illustrate the deposition of conductive materials in accordance with some embodiments.
Figure 14B:
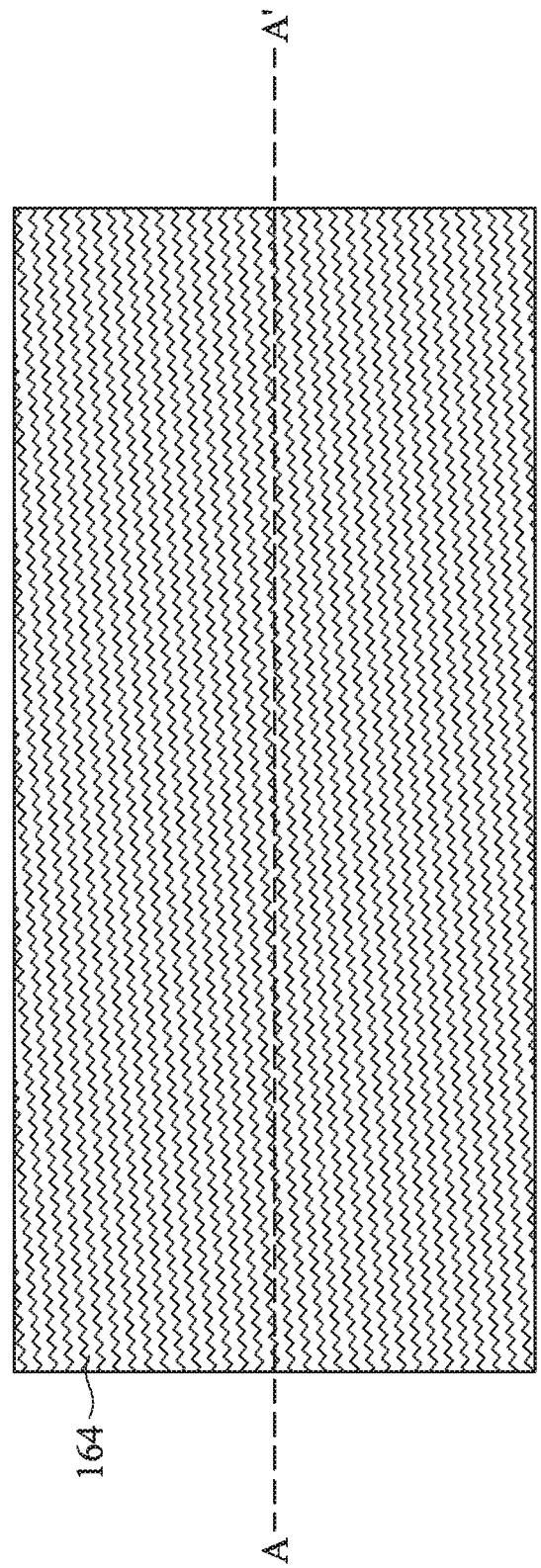

Referring to FIGS. 14A-14B and 15A-15B, contacts may be formed in the openings 146 patterned in the target layer 102. In FIGS. 14A-14B, one or more liners 162 may be formed along sidewalls and a bottom surface of the openings 146, and a conductive material 164 may be formed over the target layer 102. In some embodiments, silicide regions may be formed in source/drain regions exposed by the openings 146 prior to the formation of liners 162. The conductive material 164 may be initially deposited over the liners 162 and may overfill the openings 146, as shown in FIGS. 14A-14B. The liners 162 may include TiO, TiN, TaO, TaN, or the like, and may provide diffusion barrier, adhesion, and/or seed layers for the contacts. The liners may be deposited using any suitable process, such as PVD, CVD, ALD, and the like. The conductive material 164 may be a suitable conductive material such as copper or another conductive material, and may be deposited using a process such as PVD, plating, or the like.

Referring to FIGS. 15A-15B, a planarization process may be performed to remove excess portions of the conductive material 164 over the target layer 102. Thus, contacts may be formed in the target layer 102. The regions underneath the exposed portions 150 (see FIGS. 12A-12B) when hard mask layer 106 is patterned are regions where cuts are formed between adjacent contacts. For example, in FIG. 15B, first contact166A is separated from second contact166B by cut 170.

As discussed above in connection with FIGS. 8A-8B, in some embodiments, the length of the patterned region of upper layer 148 shown in FIGS. 8A-8B may be extended, or additional patterned regions of upper layer 148 may be formed. For example, the length of the patterned region of upper layer 148 may be extended so that the cut 170 shown in FIG. 15B extends between additional contacts. Multiple patterned regions of upper layer 148 may be used to form additional cuts that are offset from the cut 170 shown in FIG. 15B. In some cases, multi-patterning processes may be used to form the exposed portions 150 of the silicon mask layer 108 that define the cuts. In some embodiments, multiple sets of contacts may be formed in a target layer 102 by using the embodiment patterning techniques multiple times. For example, source/drain contact openings may first be formed in a target layer 102 by forming a first set of masking layers over the target layer 102 and patterning the target layer 102 using the techniques described herein. The source/drain contact openings may then be filled with a conductive material. Then, gate contact openings may be formed in the same target layer 102 by forming a second set of masking layers over the target layer 102 and patterning the target layer 102 using the techniques described herein. The gate contact openings may then be filled with a conductive material. This is an example, and these or various other sets of contacts or other conductive features may be formed at the same time or formed in this example sequence or in other sequences. By employing the embodiments discussed herein, fine pitch contacts having cuts with a cut pitch of about 20 nm or more may be formed.

Figure 16:
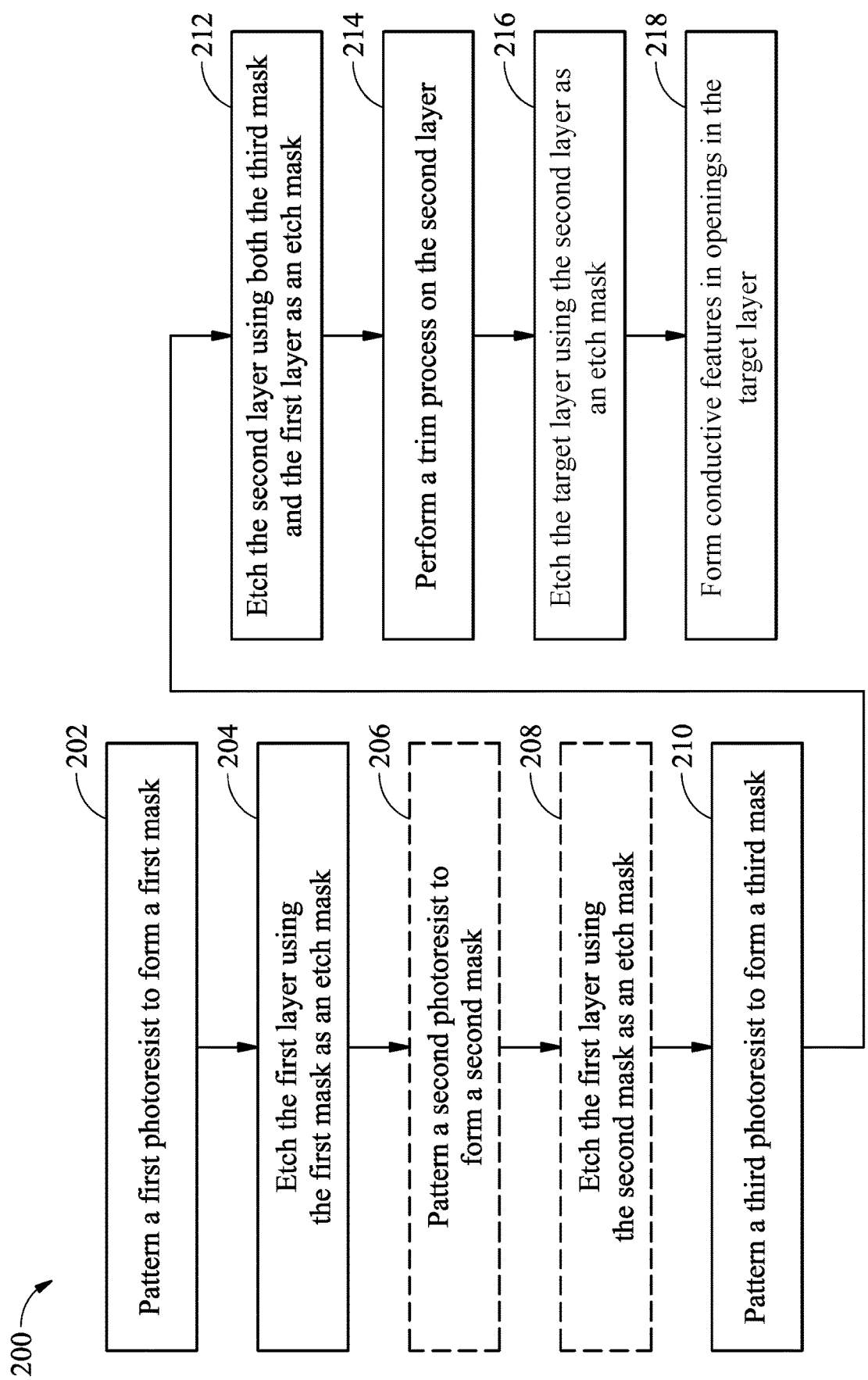
FIG. 16 is a flow chart of a method to manufacture contacts in a semiconductor device in accordance with some embodiments.

Referring to FIG. 16, a method 200 of forming conductive features in a target layer is provided. In step 202, a first photoresist is patterned to form a first mask, for example as shown in FIGS. 1-3. In step 204, a first layer is etched using the first mask as an etch mask, for example as shown in FIG. 4. The first layer is disposed over a second layer, which is disposed over the target layer. In step 206, the second photoresist is patterned to form a second mask, for example as shown in FIG. 6. In step 208, the first layer is etched using the second mask as an etch mask, for example as shown in FIGS. 7A-7B. In some embodiments, steps 206 and 208 are optional. In some embodiments, steps 206 and 208 may be repeated by, for example, patterning another photoresist to form another mask, which is used as an etch mask for etching the first layer. In step 210, a third photoresist is patterned to form a third mask, for example as shown in FIGS. 8A-9B. In step 212, the second layer is etched using both the third mask and the first layer as a combined etch mask, for example as shown in FIGS. 10A-10B. In step 214, a trim process is performed on the second layer. The trim process reduces the size of exposed portions of the second layer. In step 216, the target layer is etched using the second layer as an etch mask. The etching forms openings in the target layer. In step 218, conductive features are formed in openings in the target layer. Some of the conductive features may be separated by cuts.

In some embodiments, the patterning methods described herein may be used to form conductive features such as contacts in a target layer as depicted in FIGS. 15A-15B. As described herein, a mask is used to define regions in which contacts are formed, and then another mask is used to define regions in which cuts between the contacts are formed. Because the patterning of the cut regions is performed after the patterning of the contact regions, the patterning method described herein may be considered a "cut last" process. This is in contrast to a "cut first" process, in which the patterning of the cut regions is performed first, before the patterning of the contact regions. In some cases, multiple contacts having one or more cuts may be formed to have the same dimensions or substantially the same dimensions, which allows for greater control of resistance of the contacts. In some cases, the use of a trim process as described above with respect to FIGS. 12A-12B can reduce the width of cuts between adjacent contacts. This may allow for the size (e.g., the length) of the individual contacts to be increased without increasing the size or footprint of the semiconductor device. Increasing the size of the contacts can reduce the resistance (e.g., contact resistance, sheet resistance, etc.) of the contacts, which can improve performance of the semiconductor device. For example, power consumption of the device may be reduced. The use of a trim process as described herein may allow for the width of cuts to be reduced without increased chance of overetched cuts or incomplete cuts.

In some embodiments, a method includes forming a first mask layer over a target layer, forming a second mask layer over the first mask layer, patterning the second mask layer, forming a third mask layer over the patterned second mask layer, patterning the third mask layer, etching the first mask layer using both the patterned second mask layer and the patterned third mask layer as a combined etch mask, removing the patterned third mask layer to expose a portion of the first mask layer, performing a trim process on the exposed portion of the first mask layer, and etching the target layer using the first mask layer to form openings in the target layer. In an embodiment, the first mask layer include silicon and the second mask layer comprises silicon oxide. In an embodiment, the target layer is disposed over multiple semiconductor fins, and the target layer includes polysilicon. In an embodiment, the target layer is disposed over multiple semiconductor fins, and the target layer includes a metal. In an embodiment, the patterned third mask layer extends across a gap in the patterned second mask layer. In an embodiment, the method further includes filling the openings in the target layer with a conductive material. In an embodiment, after performing the trim process, the exposed portion of the first mask layer has a lateral width of about 20 nm. In an embodiment, the trim process includes a plasma etching process. In an embodiment, patterning the second mask layer includes forming a first patterned photoresist over the second mask layer, etching the second mask layer using the first patterned photoresist as an etch mask, removing the first patterned photoresist, forming a second patterned photoresist over the second mask layer, etching the second mask layer using the second patterned photoresist as an etch mask, and removing the second patterned photoresist.

In some embodiments a method includes depositing a silicon layer over a substrate, depositing an oxide layer over the silicon layer, patterning a plurality of first mask regions in the oxide layer, the first mask regions separated by gaps exposing the silicon layer, depositing a photoresist layer over the silicon layer, patterning a plurality of second mask regions in the photoresist layer, wherein at least one second mask region extends across a gap between adjacent first mask regions, removing portions of the silicon layer that are uncovered by the first mask regions and the second mask regions to form third mask regions in the silicon layer, removing the second mask regions, performing an etching process to etch portions of the third mask regions uncovered by the first mask regions, and after the performing the etching process, removing portions of the substrate that are uncovered by the third mask regions. In an embodiment, removing portions of the substrate forms openings in the substrate, and the method further includes forming contacts in the openings in the substrate. In an embodiment, the etching process etches sidewalls of a first one of the third mask regions that is covered by the first mask regions less than the etching process etches sidewalls of a second one of the third mask regions that is uncovered by the first mask regions. In an embodiment, performing the etching process includes performing a dry etching process. In an embodiment, the dry etching process uses HBr or $Cl_2$ as a process gas. In an embodiment, performing the etching process includes performing a wet etching process. In an embodiment, performing the wet etching process includes using $NH_4OH$ as an etchant.

In some embodiments, a method includes forming a target layer over a substrate, forming a first mask layer over the target layer, the first mask layer including a first material, forming a patterned dielectric layer over the first mask layer, the dielectric layer including a second material different from the first material, forming a patterned photoresist over the patterned dielectric layer, the photoresist including a third material different from the first material, etching the first mask layer using a first etch process, wherein the first etch process is selective to the first material over the second material and the third material, removing the patterned photoresist to expose first portions of the first mask layer, trimming the first portions of the first mask layer using a second etch process, the second etch process is selective to the first material over the second material, and transferring patterns in the etched first mask layer into the target layer. In an embodiment, the first material is silicon and the second material is silicon oxide. In an embodiment, the method includes forming multiple contacts in the target layer. In an embodiment, a separation between a first contact and a second contact of the multiple contacts is about 20 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first mask layer over a target layer;
    forming a second mask layer over the first mask layer;
    patterning the second mask layer;
    forming a third mask layer over the patterned second mask layer;
    patterning the third mask layer;
    etching the first mask layer using both the patterned second mask layer and the patterned third mask layer as a combined etch mask;
    removing the patterned third mask layer to expose a portion of the first mask layer;
    performing a trim process on the exposed portion of the first mask layer; and
    etching the target layer using the first mask layer to form openings in the target layer.

2. The method according to claim 1, wherein the first mask layer comprises silicon and the second mask layer comprises silicon oxide.

3. The method according to claim 1, wherein the target layer is disposed over a plurality of semiconductor fins, and wherein the target layer comprises polysilicon.

4. The method according to claim 1, wherein the target layer is disposed over a plurality of semiconductor fins, and wherein the target layer comprises a metal.

5. The method according to claim 1, wherein the patterned third mask layer extends across a gap in the patterned second mask layer.

6. The method according to claim 1, further comprising filling the openings in the target layer with a conductive material.

7. The method according to claim 1, wherein after performing the trim process, the exposed portion of the first mask layer has a lateral width of about 20 nm.

8. The method according to claim 1, wherein the trim process comprises a plasma etching process.

9. The method according to claim 1, wherein patterning the second mask layer comprises:
    forming a first patterned photoresist over the second mask layer;
    etching the second mask layer using the first patterned photoresist as an etch mask;
    removing the first patterned photoresist;
    forming a second patterned photoresist over the second mask layer;
    etching the second mask layer using the second patterned photoresist as an etch mask; and
    removing the second patterned photoresist.

10. A method comprising:
    depositing a silicon layer over a substrate;
    depositing an oxide layer over the silicon layer;
    patterning a plurality of first mask regions in the oxide layer, the first mask regions separated by gaps exposing the silicon layer;
    depositing a photoresist layer over the silicon layer;
    patterning a plurality of second mask regions in the photoresist layer, wherein at least one second mask region extends across a gap between adjacent first mask regions;
    removing portions of the silicon layer that are uncovered by the first mask regions and the second mask regions to form third mask regions in the silicon layer;
    removing the second mask regions;
    performing an etching process to etch portions of the third mask regions uncovered by the first mask regions; and
    after the performing the etching process, removing portions of the substrate that are uncovered by the third mask regions.

11. The method according to claim 10, wherein removing portions of the substrate forms openings in the substrate, and further comprising forming contacts in the openings in the substrate.

12. The method according to claim 10, wherein the etching process etches sidewalls of a first one of the third mask regions that is covered by the first mask regions less than the etching process etches sidewalls of a second one of the third mask regions that is uncovered by the first mask regions.

13. The method according to claim 10, wherein performing the etching process comprises performing a dry etching process.

14. The method according to claim 13, wherein the dry etching process uses HBr or CL as a process gas.

15. The method according to claim 10, wherein performing the etching process comprises performing a wet etching process.

16. The method according to claim 15, wherein performing the wet etching process comprises using $NH_4OH$ as an etchant.

17. A method comprising:
    forming a target layer over a substrate;
    forming a first mask layer over the target layer, the first mask layer comprising a first material;
    forming a patterned dielectric layer over the first mask layer, the dielectric layer comprising a second material different from the first material;
    forming a patterned photoresist over the patterned dielectric layer, the photoresist comprising a third material different from the first material;

etching the first mask layer using a first etch process, wherein the first etch process is selective to the first material over the second material and the third material;

removing the patterned photoresist to expose first portions of the first mask layer;

trimming the first portions of the first mask layer using a second etch process, the second etch process is selective to the first material over the second material; and transferring patterns in the etched first mask layer into the target layer.

18. The method according to claim 17, wherein the first material is silicon and the second material is silicon oxide.

19. The method according to claim 17, further comprising forming a plurality of contacts in the target layer.

20. The method according to claim 19, wherein a separation between a first contact and a second contact of the plurality of contacts is about 20 nm.

\* \* \* \* \*

UNITED STATES PATENT AND TRADEMARK OFFICE
CERTIFICATE OF CORRECTION

PATENT NO. : 10,699,943 B2
APPLICATION NO. : 15/967492
DATED : June 30, 2020
INVENTOR(S) : Huang Page 1 of 1

It is certified that error appears in the above-identified patent and that said Letters Patent is hereby corrected as shown below:

In the Claims

In Column 14, Line 51, Claim 14, delete "CL" and insert --$Cl_2$--.

Signed and Sealed this
Eighth Day of September, 2020

Andrei Iancu
*Director of the United States Patent and Trademark Office*